(12) United States Patent
Kim et al.

(10) Patent No.: US 10,985,333 B2
(45) Date of Patent: Apr. 20, 2021

(54) FLEXIBLE DISPLAY APPARATUS AND ROLLABLE DISPLAY APPARATUS COMPRISING THE SAME

(71) Applicant: LG DISPLAY CO., LTD., Seoul (KR)

(72) Inventors: DongYoon Kim, Osan-si (KR); YounYeol Yu, Osan-si (KR); Hoiyong Kwon, Osan-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/222,590

(22) Filed: Dec. 17, 2018

(65) Prior Publication Data
US 2019/0198783 A1 Jun. 27, 2019

(30) Foreign Application Priority Data

Dec. 22, 2017 (KR) .......................... 10-2017-0177963

(51) Int. Cl.
*H01L 51/00* (2006.01)
*H01L 27/32* (2006.01)
(Continued)

(52) U.S. Cl.
CPC ..... *H01L 51/0097* (2013.01); *B65H 75/4402* (2013.01); *H01L 23/4985* (2013.01); *H01L 27/156* (2013.01); *H01L 27/322* (2013.01); *H01L 27/3244* (2013.01); *H01L 33/483* (2013.01); *H01L 33/502* (2013.01); *H01L 33/58* (2013.01); *H01L 51/5237* (2013.01); *H01L 51/5281* (2013.01); *B65H 2301/4165* (2013.01); *H01L 2251/5338* (2013.01)

(58) Field of Classification Search
CPC ............. H01L 51/0097; H01L 23/4985; H01L 27/156; H01L 27/322; H01L 27/3244; H01L 33/483; H01L 33/502; H01L 33/58; H01L 51/5237; H01L 51/5281; H01L 2251/5338; B65H 75/4402; B65H 2301/4165; G06F 1/1652; G09F 9/301; G02F 1/133305
See application file for complete search history.

(56) References Cited

U.S. PATENT DOCUMENTS 9,557,874 B2 * 1/2017 Franklin ............... G06F 1/1652
2009/0207560 A1 8/2009 Lee
(Continued)

FOREIGN PATENT DOCUMENTS

CN 104680943 A 6/2015
CN 105929990 A 9/2016
(Continued)

*Primary Examiner* — Rockshana D Chowdhury
(74) *Attorney, Agent, or Firm* — Birch, Stewart, Kolasch & Birch LLP

(57) ABSTRACT

Discussed are a flexible display apparatus and a rollable display apparatus comprising the same, in which rigidity reliability is secured against a physical impact. The flexible display panel includes a display unit provided on a flexible substrate and a back cover disposed on a rear surface of the flexible display panel. The back cover includes a panel supporting part including a plurality of openings, having a size greater than a width of the flexible display panel, and supporting the flexible display panel, and a sidewall part protruding from each of one edge and another edge of the panel supporting part.

22 Claims, 11 Drawing Sheets

(51) Int. Cl.
  *H01L 51/52* (2006.01)
  *H01L 27/15* (2006.01)
  *H01L 23/498* (2006.01)
  *B65H 75/44* (2006.01)
  *H01L 33/48* (2010.01)
  *H01L 33/50* (2010.01)
  *H01L 33/58* (2010.01)

(56) References Cited

U.S. PATENT DOCUMENTS

| | | | |
|---|---|---|---|
| 2011/0176260 A1* | 7/2011 | Walters | G06F 1/1641 |
| | | | 361/679.01 |
| 2012/0204453 A1 | 8/2012 | Jung | |
| 2013/0140965 A1* | 6/2013 | Franklin | G06F 1/1626 |
| | | | 312/223.1 |
| 2013/0321740 A1 | 12/2013 | An et al. | |
| 2014/0159569 A1 | 6/2014 | Hwang | |
| 2014/0268623 A1* | 9/2014 | Kim | H04M 1/0249 |
| | | | 361/809 |
| 2015/0062840 A1* | 3/2015 | Kim | H05K 5/0086 |
| | | | 361/749 |
| 2015/0378391 A1 | 12/2015 | Huitema et al. | |
| 2016/0255713 A1* | 9/2016 | Kim | G02F 1/133305 |
| | | | 361/749 |
| 2016/0316575 A1 | 10/2016 | Lee | |
| 2016/0341997 A1* | 11/2016 | Fukushima | G02F 1/1368 |
| 2016/0357052 A1 | 12/2016 | Kim et al. | |
| 2017/0079149 A1 | 3/2017 | Lee et al. | |
| 2017/0141168 A1 | 5/2017 | Choi | |
| 2017/0310798 A1 | 10/2017 | Song et al. | |
| 2017/0357289 A1 | 12/2017 | Ahn | |
| 2018/0375056 A1 | 12/2018 | Sonoda et al. | |

FOREIGN PATENT DOCUMENTS

| | | |
|---|---|---|
| CN | 106030687 A | 10/2016 |
| CN | 106097896 A | 11/2016 |
| CN | 106251779 A | 12/2016 |
| CN | 205943344 U | 2/2017 |
| CN | 107464503 A | 12/2017 |
| EP | 3107083 A1 | 12/2016 |
| JP | 2013-242525 A | 12/2013 |
| KR | 10-2016-0127277 A | 11/2016 |
| TW | 201428959 A | 7/2014 |
| TW | I539416 B | 6/2016 |
| WO | WO 2017/010329 A1 | 1/2017 |

* cited by examiner

FLEXIBLE DISPLAY APPARATUS AND ROLLABLE DISPLAY APPARATUS COMPRISING THE SAME

CROSS-REFERENCE TO RELATED APPLICATIONS

This application claims the priority benefit of the Korean Patent Application No. 10-2017-0177963 filed in the Republic of Korea on Dec. 22, 2017, which is hereby incorporated by reference as if fully set forth herein.

BACKGROUND

Field of the Invention

The present disclosure relates to a flexible display apparatus and a rollable display apparatus comprising the same.

Discussion of the Related Art

Display apparatuses are being widely used as a display screen for various products such as televisions (TVs), notebook computers, and monitors as well as portable electronic devices such as mobile communication terminals, electronic notebooks, e-books, portable multimedia players (PMPs), navigation devices, ultra-mobile personal computers (PCs), mobile phones, smartphones, tablet personal computers (PCs), and watch phones.

In display apparatuses, organic light emitting display apparatuses and electrophoresis display apparatuses can be thin in thickness, and research and development for implementing the display apparatuses as flexible display apparatuses are being made. Particularly, research and development are being actively made on rollable display apparatuses including a flexible display panel capable of being rolled like a roll recently.

In a related art rollable display apparatus, a back cover is attached on a rear surface of a flexible display panel, and thus, the rigidity reliability of the flexible display panel can be secured.

However, the related art rollable display apparatus is easily damaged or broken down by an external physical impact applied to a side surface of the flexible display panel. Also, in the related art rollable display apparatus, the flexible display panel is scratched due to a physical contact between the back cover and the flexible display panel and/or particles which penetrate into a gap between the back cover and the flexible display panel, and a crack occurs due to the particles and spreads. Also, in the related art rollable display apparatus, when a mismatch occurs between both sides (or left and right sides) of the flexible display panel while the flexible display panel is being wound around a roller part, the center of the flexible display panel can be crumpled. As a result, the flexible display panel can be damaged or broken down.

Information disclosed in this Background section was already known to the present inventors before achieving the present disclosure and/or is technical information acquired in the process of achieving the present disclosure. Therefore, it may contain information that would not be considered prior art that is already known to the public in this country.

SUMMARY

Accordingly, the present disclosure is directed to providing a flexible display apparatus and a rollable display apparatus comprising the same that substantially obviate one or more problems due to limitations and disadvantages of the related art.

An aspect of the present disclosure is directed to providing a flexible display apparatus and a rollable display apparatus comprising the same, in which rigidity reliability is secured against a physical impact.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided a flexible display apparatus including a flexible display panel including a display unit provided on a flexible substrate and a back cover disposed on a rear surface of the flexible display panel, wherein the back cover includes a panel supporting part including a plurality of openings, having a size greater than a width of the flexible display panel, and supporting the flexible display panel and a sidewall part protruding from each of one edge and another edge of the panel supporting part.

In another aspect of the present disclosure, there is provided a rollable display apparatus including a flexible display apparatus, a housing module which the flexible display apparatus is wound around or unwound from, a roller part installed in the housing module and connected to the flexible display apparatus, and a panel rolling module winding or unwinding the flexible display apparatus around or from the roller part according to folding or unfolding of at least one retractable unit installed in the housing module and coupled to an upper portion of the flexible display apparatus, wherein the flexible display apparatus includes a flexible display apparatus including a flexible display panel including a display unit provided on a flexible substrate and a back cover disposed on a rear surface of the flexible display panel, and wherein the back cover includes a panel supporting part including a plurality of openings, having a size greater than a width of the flexible display panel, and supporting the flexible display panel and a sidewall part protruding from each of one edge and another edge of the panel supporting part.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION OF THE DISCLOSURE

Figure 1:
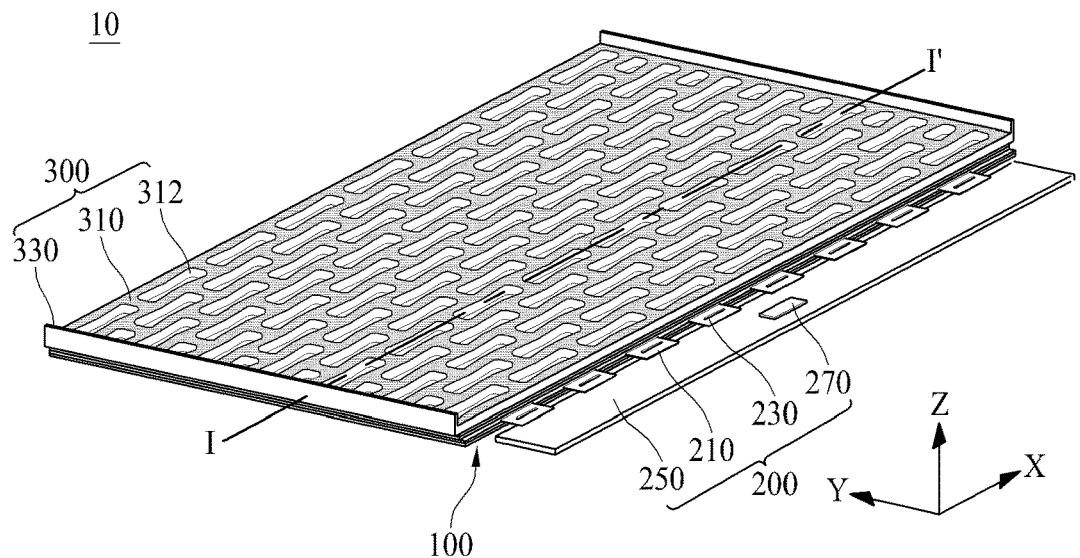
FIG. 1 is a diagram illustrating a flexible display apparatus according to a first embodiment of the present disclosure.

Reference will now be made in detail to the exemplary embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Furthermore, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known technology is determined to unnecessarily obscure the important point of the present disclosure, the detailed description will be omitted or will be brief.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, embodiments of a flexible display apparatus and a rollable display apparatus comprising the same according to the present disclosure will be described in detail with reference to the accompanying drawings. In adding reference numerals to elements of each of the drawings, although the same elements are illustrated in other drawings, like reference numerals may refer to like elements. In the following description, when the detailed description of the relevant known function or configuration is determined to unnecessarily obscure the important point of the present disclosure, the detailed description will be omitted.

Figure 2:
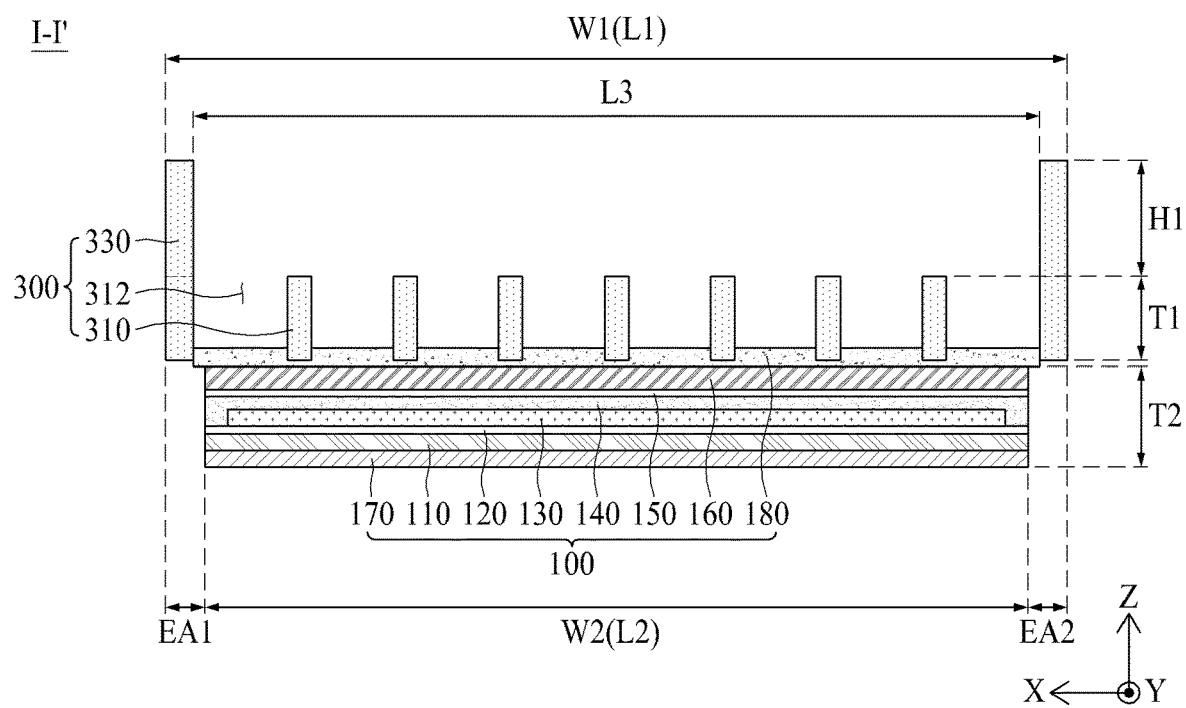
FIG. 2 is a cross-sectional view taken along line I-I' of FIG. 1.
Figure 3:
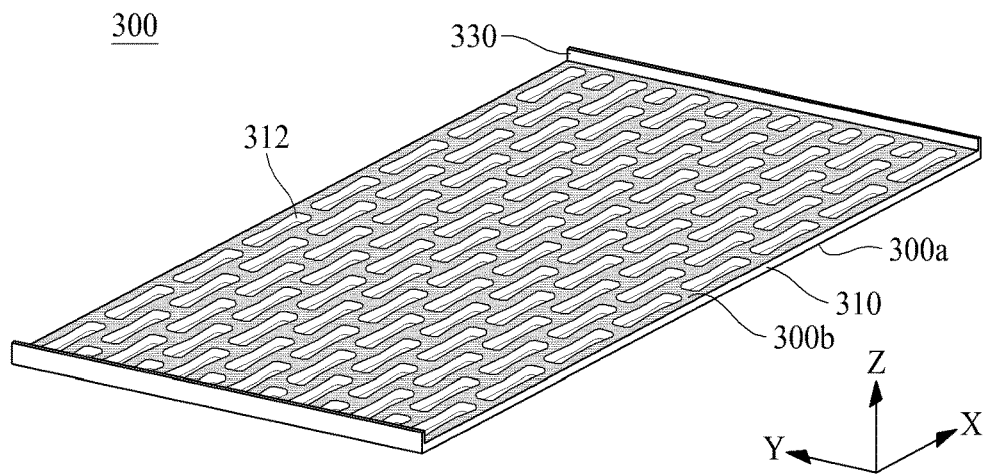
FIG. 3 is a diagram illustrating a back cover illustrated in FIGS. 1 and 2.

FIG. 1 is a diagram illustrating a flexible display apparatus 10 according to a first embodiment of the present disclosure. FIG. 2 is a cross-sectional view taken along line I-I' of FIG. 1. FIG. 3 is a diagram illustrating a back cover illustrated in FIGS. 1 and 2. All the components of the flexible display apparatuses according to all embodiments of the present disclosure are operatively coupled and configured.

Referring to FIGS. 1 to 3, the flexible display apparatus 10 according to the first embodiment of the present disclosure can include a flexible display panel 100 and a back cover 300.

The flexible display panel 100 can include a first substrate 110, a display unit 130, a passivation layer 140, and a second substrate 160.

The first substrate 110, which is a base substrate, can be a flexible substrate. For example, the first substrate 110 can include a transparent polyimide material. The first substrate 110 including the transparent polyimide material can be formed by curing a polyimide resin which is coated to have a certain thickness on a front surface of a release layer provided on a carrier glass substrate. In this case, the carrier glass substrate can be separated from the first substrate 110 by releasing the release layer through a laser release process.

The first substrate 110 can include a display area and a non-display area. The display area can be an area which displays an image, and can be defined in a center portion of the first substrate 110. The non-display area can be an area which does not display an image, and can be defined in an edge of the first substrate 110 to surround the display area.

A buffer layer 120 can be provided on a first surface of the first substrate 110. The buffer layer 120 can be provided on the entire first surface of the first substrate 110, for preventing water from penetrating into the display area via the first substrate 110. The buffer layer 120 according to an embodiment can be formed of a plurality of inorganic layers which are alternately stacked. For example, the buffer layer 120 can be formed of a multiplayer where one or more inorganic layers of silicon oxide (SiOx), silicon nitride (SiNx), and silicon oxynitride (SiON) are alternately stacked. The buffer layer 120 can be omitted.

The display unit 130 can include a pixel array layer which is disposed in the display area of the first substrate 110. That is, the pixel array layer can be provided on the buffer layer 120 or the first surface of the first substrate 110 overlapping the display area defined on the first substrate 110.

The pixel array layer can include a plurality of gate lines, a plurality of data lines, a plurality of driving power lines, a pixel driving circuit, and a light emitting device layer.

The gate lines and the data lines can be disposed on the first substrate 110 to intersect one another. The driving power lines can be arranged on the first substrate 110 in parallel with the data lines or the gate lines.

The pixel driving circuit can be provided in each of a plurality of pixel areas defined by intersections of the gate lines and the data lines and can include at least two thin film transistors (TFTs) and at least one capacitor. The pixel driving circuit can allow the light emitting device layer to emit light according to a gate signal supplied through an adjacent gate line, a driving power supplied through an adjacent driving power line, and a data signal supplied through an adjacent data line.

The light emitting device layer can emit light, based on a data signal supplied from the pixel driving circuit of a corresponding pixel. The light emitted from the light emitting device layer can pass through the first substrate 110 and can be extracted to the outside. The light emitting device layer can include a first electrode connected to the pixel driving circuit of a corresponding pixel, a light emitting layer provided on the first electrode, and a second electrode provided on the light emitting layer.

The first electrode can be an anode electrode which is individually patterned in each of a plurality of pixels. The first electrode can be formed of a transparent metal material such as indium tin oxide (ITO) or indium zinc oxide (IZO) capable of transmitting light.

The light emitting layer according to an embodiment can include a red light emitting layer, a green light emitting layer, and a blue light emitting layer, which each emit light corresponding to a color set in a corresponding pixel.

According to another embodiment, the light emitting layer can be a common layer which is provided in common in the plurality of pixels, and in this case, a manufacturing process is simplified. The light emitting layer can include one of an organic light emitting layer, an inorganic light emitting layer, and a quantum dot light emitting layer, or can include a stacked or mixed structure of an organic light emitting layer or an inorganic light emitting layer and a quantum dot light emitting layer. The light emitting layer can include two or more light emitting parts for emitting white light. For example, the light emitting layer can include a first light emitting part and a second light emitting part for emitting the white light based on a combination of first light and second light. Here, the first light emitting part can emit the first light and can include one of a blue light emitting part, a green light emitting part, a red light emitting part, a yellow light emitting part, and a yellow-green light emitting part. The second light emitting part can include a light emitting part emitting light having a complementary color relationship of the first light among a blue light emitting part, a green light emitting part, a red light emitting part, a yellow light emitting part, and a yellow-green emitting part.

In a case where the light emitting layer is provided as a common layer, the display unit 130 can include a wavelength conversion layer provided between the first substrate 110 and the light emitting device layer. The wavelength conversion layer according to an embodiment can include a color filter which transmits only a wavelength of a color, set in a pixel, of white light incident from the light emitting device layer of each pixel. For example, the wavelength conversion layer can transmit only a wavelength of red, green, or blue.

According to another embodiment, the wavelength conversion layer can include a quantum dot having a size which re-emits light based on the white light incident from the light emitting device layer of each pixel to emit light of a color set in a pixel. Here, the quantum dot can be selected from among CdS, CdSe, CdTe, CdZnSeS, ZnS, ZnSe, GaAs, GaP, GaAs—P, Ga—Sb, InAs, InP, InSb, AlAs, AlP, and AlSb. For example, a quantum dot including CdSe or InP can emit red light, a quantum dot including CdZnSeS can emit green light, and a quantum dot including ZnSe can emit blue light. In this manner, if the wavelength conversion layer includes the quantum dot, a color reproduction rate increases.

According to another embodiment, the wavelength conversion layer can include a color filter including a quantum dot.

The second electrode, which is a cathode electrode, can be a common layer which is provided in common in the plurality of pixels. The second electrode can include a metal material, which is high in reflectivity. For example, the second electrode can be formed in a multilayer structure such as a stacked structure (Ti/Al/Ti) of Al and Ti, a stacked structure (ITO/Al/ITO) of Al and ITO, an APC (Ag/Pd/Cu) alloy, or a stacked structure (ITO/APC/ITO) of an APC alloy and ITO, or can include a single-layer structure including one material or two or more alloy materials selected from among Ag, Al, Mo, Au, Mg, Ca, and Ba.

The plurality of pixels according to the first embodiment of the present disclosure can be arranged in a stripe structure in the display area. In this case, one unit pixel can include a red pixel, a green pixel, and a blue pixel, and moreover, can further include a white pixel.

According to another embodiment, the plurality of pixels can be arranged in a pentile structure in the display area. In this case, each of the plurality of unit pixels can include one red pixel, two green pixels, and one blue pixel, which are one-dimensionally arranged as a polygonal type. For example, each of the unit pixels having the pentile structure can include one red pixel, two green pixels, and one blue pixel, which are one-dimensionally arranged as an octagonal type. In this case, the blue pixel can have a largest size, and each of the two green pixels can have a smallest size.

The passivation layer 140 can be provided to surround the display unit 130. The passivation layer 140 prevents oxygen or water from penetrating into the light emitting device layer. The passivation layer 140 according to an embodiment can include at least one inorganic layer. The inorganic layer can be formed of silicon nitride, aluminum nitride, zirconium nitride, titanium nitride, hafnium nitride, tantalum nitride, silicon oxide, aluminum oxide, titanium oxide, and/or the like. Optionally, the passivation layer 140 can further include at least one organic layer. The organic layer can be provided to have a sufficient thickness for preventing particles from penetrating into the light emitting device layer via the passivation layer 140. The passivation layer 140 can be referred to as an encapsulation layer.

The second substrate 160 can be disposed on the passivation layer 140 and can include a first surface adjacent to the passivation layer 140 and a second surface opposite to the first surface. The first surface of the second substrate 160 can be attached on the passivation layer 140. The second substrate 160 can be referred to as an opposite substrate or an encapsulation substrate. The second substrate 160 can primarily prevent oxygen or water from penetrating into the light emitting device layer. The second substrate 160 according to an embodiment can have a thickness of 100 μm or less, which prevents penetration of oxygen or water and enables the flexible display panel 100 to be bent.

The second substrate 160 according to an embodiment can be a metal foil, a metal sheet, or a metal plate, which is formed of an opaque metal material. For example, the second substrate 160 can be formed of an alloy of iron (Fe) and nickel (Ni) having a low thermal expansion coefficient, but is not limited thereto.

The first surface of the second substrate 160 can be attached on the passivation layer 140 by an adhesive layer 150. The adhesive layer 150 can be a thermocurable adhesive, a naturally curable adhesive, or the like. For example, the adhesive layer 150 can be formed of a material such as a pressure sensitive adhesive or a barrier pressure sensitive adhesive having an absorption function.

The flexible display apparatus according to the first embodiment of the present disclosure can further include a light-transmitting film 170 which is attached on the first substrate 110 of the flexible display panel 100.

The light-transmitting film 170 can be attached on the second surface opposite to the first surface of the first substrate 110 by using a transparent adhesive layer, thereby protecting a light output surface of the flexible display panel 100 and increasing a rigidity of a front surface of the flexible display panel 100. The light-transmitting film 170 according to an embodiment can be formed of a flexible film, and for example, can be one of a polyethylene terephthalate film, an anti-reflective film, a polarizing film, and a transmittance controllable film. The light-transmitting film 170 can be attached on the second surface, separated from the carrier glass substrate, of the first substrate 110. The transparent adhesive layer can be an optically clear resin (OCR), an optically clear adhesive (OCA), or the like.

The flexible display apparatus according to the first embodiment of the present disclosure can further include a touch panel for a user interface using a user touch. The touch panel can be disposed between the first substrate 110 and the light-transmitting film 170, or can be embedded into the flexible display panel 100 in an in-cell touch type in a process of forming a pixel array part.

The flexible display apparatus according to the first embodiment of the present disclosure can further include a gate driving circuit and a display driving circuit unit 200.

The gate driving circuit can be provided in the non-display area of the first substrate 110. The gate driving circuit can generate the gate signal according to a gate control signal supplied from the display driving circuit unit 200 and can supply the gate signal to a gate line corresponding to a predetermined order. The gate driving circuit according to an embodiment can be provided in the non-display area of the first substrate 110 along with a TFT. For example, the gate driving circuit can be disposed in at least one of a first non-display area and a second non-display area of the first substrate 110.

The display driving circuit unit 200 can be connected to a pad part provided in a third non-display area of the first substrate 110 and can display an image, corresponding to video data supplied from a display driving system (or a host system), on each of the plurality of pixels. The display driving circuit unit 200 according to an embodiment can include a plurality of flexible circuit films 210, a plurality of data driving integrated circuits (ICs) 230, a printed circuit board (PCB) 250, and a timing controller 270.

A plurality of input terminals provided on one sides of the plurality of flexible circuit films 210 can be attached on the PCB 250 through a film attachment process, and a plurality of output terminals provided on the other sides of the plurality of flexible circuit films 210 can be attached on the pad part provided on the first substrate 110 through the film attachment process.

The plurality of data driving ICs 230 can be respectively mounted on the plurality of flexible circuit films 210. Each of the plurality of data driving ICs 230 can receive pixel data and a data control signal supplied from the timing controller 270, convert the pixel data into a pixel-based analog data signal according to the data control signal, and supply the analog data signal to a corresponding data line.

Each of the plurality of data driving ICs 230 can be connected to the touch panel, can sense a capacitance variation of a touch sensor to generate touch raw data, and can supply the generated touch raw data to the display driving system.

The PCB 250 can support the timing controller 270 and can transfer signals and a power between the elements of the display driving circuit unit 200. The PCB 250 can include a passive element and/or an IC, which is used to generate a voltage necessary for driving of the flexible display panel 100, the data driving ICs 230, and the timing controller 270. Here, the passive element can include at least one of a resistor, a capacitor, and inductor, or a combination thereof. The IC can include a logic circuit, a power generation circuit, or a clock generation circuit.

The timing controller 270 can be mounted on the PCB 250 and can receive the video data and a timing synchronization signal supplied from the display driving system through a user connector provided on the PCB 250. The timing controller 270 can align the video data to generate pixel data matching a pixel arrangement structure of the display unit 130, based on the timing synchronization signal and can supply the generated pixel data to a corresponding data driving IC 230. Also, the timing controller 270 can generate the data control signal and the gate control signal, based on the timing synchronization signal, control a driving timing of each of the data driving ICs 230 by using the data control signal, and control a driving timing of the gate driving circuit by using the gate control signal. Here, the gate control signal can be supplied to a corresponding gate driving circuit through a first and/or last flexible circuit film of the plurality of flexible circuit films 210 and the non-display area of the first substrate 110.

The back cover 300 can be disposed on a rear surface of the flexible display panel 100. That is, the back cover 300 can be coupled to the second substrate 160 of the flexible display panel 100 by a cover adhesive member 180. The back cover 300 can support the rear surface of the flexible display panel 100 and can increase the rear rigidity and side rigidity of the flexible display panel 100 against an external physical impact. For example, the back cover 300 can be formed of one of Al, Mg, an Al alloy, a Mg alloy, and a Mg—Li alloy.

The back cover 300 according to the first embodiment can include a panel supporting part 310 and a sidewall part 330.

The panel supporting part 310 can include a plurality of openings 312 and can support the flexible display panel 100. The panel supporting part 310 can include a first surface (e.g., a front surface) 300a coupled to the flexible display panel 100 and a second surface (e.g., a rear surface) 300b opposite to the first surface 300a.

A size of the panel supporting part 310 according to an embodiment can be greater than a width of the flexible display panel 100. That is, a first width W of the panel supporting part 310 can be wider than a second width W2 of the flexible display panel 100 with respect to a first direction X parallel to a long side lengthwise direction of the flexible display panel 100. For example, a long side length L1 of the panel supporting part 310 can be longer than a long side length L2 of the flexible display panel 100.

A thickness T1 of the panel supporting part 310 according to an embodiment can be thinner than a thickness T2 of the flexible display panel 100. For example, the flexible display panel 100 can have the thickness T2 of 200 μm to 300 μm so as to be rolled or bent like a roll, and the panel supporting part 310 can have the thickness T1 of 150 μm to 250 μm so as to ensure bending of the flexible display panel 100 and increase the rigidity of the flexible display panel 100. Also, a total thickness of the flexible display apparatus according to the first embodiment of the present disclosure can be about 350 μm to 600 μm, but is not limited thereto and can include other variations.

The plurality of openings 312 can be provided to vertically pass through the first surface 300a and the second surface 300b of the panel supporting part 310 in a vertical direction Z parallel to a thickness direction of the panel supporting part 310. For example, each of the openings 312 can two-dimensionally have various shapes such as a rectangular shape or an elliptical shape. The panel supporting part 310 including the plurality of openings 312 can be referred to as a mesh plate or a porous plate. For example, the plurality of openings 312 can be formed through a metal plate patterning process using an etching process.

The plurality of openings 312 according to an embodiment can be spaced apart from one another, arranged at certain intervals in the first direction X, and arranged at certain intervals in a second direction Y intersecting the first direction X. In this case, openings 312 arranged in the second direction Y can be arranged in parallel or in a zigzag type. In this case, centers of openings 312 disposed in even-numbered columns of a plurality of columns parallel to the first direction X can be disposed between openings 312 disposed in odd-numbered columns. The plurality of openings 312 can decrease a weight of the back cover 300 and can accommodate particles to prevent the flexible display panel 100 from being scratched by the particles, thereby preventing a crack from occurring in the flexible display panel 100 due to the scratch caused by the particles. Also, the plurality of openings 312 can be elastically compressed (contracted or expanded) when the flexible display panel 100 is bent or rolled like a roller. Accordingly, when the flexible display panel 100 is rolled, the flexible display panel 100 is prevented from being slipped, and a bending stress which includes a compression stress and a tension stress applied to the flexible display panel 100 is minimized, thereby preventing the flexible display panel 100 from being damaged or broken down due to the bending stress.

The panel supporting part 310 according to an embodiment can be coupled to the second substrate 160 of the flexible display panel 100 by the cover adhesive member 180.

The cover adhesive member 180 can be disposed between the panel supporting part 310 of the back cover 300 and the second substrate 160 of the flexible display panel 100 and can physically couple the back cover 300 to the flexible display panel 100. The cover adhesive member 180 according to an embodiment can be an OCA, OCR or a pressure sensitive adhesive. For example, the cover adhesive member 180 can be attached on the second substrate 160 so as to have the thickness of 30 μm to 70 μm, and then, can be attached on the panel supporting part 310 of the back cover 300. The cover adhesive member 180 can be filled into a portion or all of each of the plurality of openings 312.

For example, the cover adhesive member 180 can flow into only a lower end of each of openings 312 adjacent to the second substrate 160 of the flexible display panel 100 when performing a laminating process on the back cover 300 and the flexible display panel 100 and can be filled into a half or less portion of each of the openings 312. In this case, a contact area between the back cover 300 and the flexible display panel 100 can increase, thereby absorbing a bending stress which is applied to the plurality of openings 312 when the flexible display panel 100 is bent.

As another example, the cover adhesive member 180 can flow into each of the plurality of openings 312 when performing the laminating process on the back cover 300 and the flexible display panel 100 and can be wholly filled into each of the plurality of openings 312. In this case, a contact area between the back cover 300 and the flexible display panel 100 can increase, thereby preventing the back cover 300 from being peeled from the flexible display panel 100.

The sidewall part 330 can protrude from each of one edge EA1 and the other edge EA2 of the panel supporting part 310. That is, the sidewall part 330 can protrude from each of the one edge EA1 and the other edge EA2 of the second surface 300b of the panel supporting part 310. In this case, the sidewall part 330 according to an embodiment can protrude from each of the one edge EA1 and the other edge EA2 of the panel supporting part 310 to have the form of solid lines or lines long extending in the second direction Y. According to another embodiment, the sidewall part 330 can protrude from each of the one edge EA1 and the other edge EA2 of the panel supporting part 310 to have the form of dotted lines which have certain intervals therebetween and a certain length in the second direction Y, and in this case, a weight of the back cover 300 can be reduced.

The sidewall part 330 can be provided in plurality. A distance L3 between a sidewall part 330 provided in the one edge EA1 of the panel supporting part 310 and a sidewall part 330 provided in the other edge EA2 of the panel supporting part 310 can be longer than the second width W2 of the flexible display panel 100 or the long side length L2 of the flexible display panel 100. When the flexible display panel 100 is being rolled, the sidewall part 330 can be separated from a side surface of the flexible display panel 100 disposed on the first surface 300a of the panel supporting part 310, thereby enabling the flexible display panel 100 to be smoothly rolled.

A height H1 of the sidewall part 330 according to an embodiment can be set higher than the thickness T2 of the flexible display panel 100. Therefore, the sidewall part 330 can prevent a contact between a front surface (or a display surface) of the flexible display panel 100 and a rear surface (or a rear surface of the supporting part) of the back cover 300 when the flexible display panel 100 is being rolled like a roller, and thus, even when there are particles on the front surface of the flexible display panel 100 or the rear surface of the back cover 300, the flexible display panel 100 is prevented from being scratched due to the particles. Also, when the flexible display panel 100 is being rolled like a roller, the sidewall part 330 can guide the rolling of the flexible display panel 100 to minimize a rolling deviation between both sides (e.g., left and right sides) of the flexible display panel 100, thereby preventing a center of the flexible display panel 100 from being crumpled due to the rolling deviation between both sides (e.g., left and right sides) of the flexible display panel 100. Also, the sidewall part 330 can protrude more outward than the side surface of the flexible display panel 100, and thus, can protect the side surface of the flexible display panel 100 from an external physical impact, thereby preventing the flexible display panel 100 from being damaged by the external physical impact.

Figure 4:
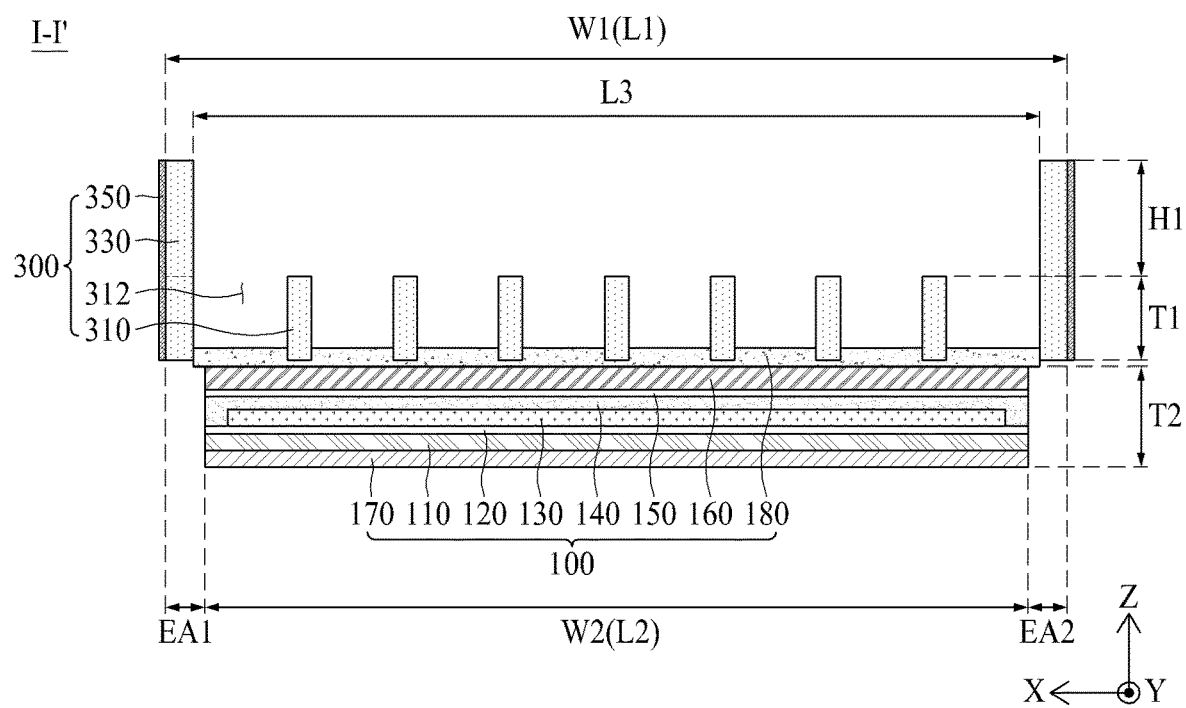
FIG. 4 is a cross-sectional view illustrating a coating layer provided in the back cover illustrated in FIGS. 1 to 3.

Additionally, as illustrated in FIG. 4, the back cover 300 according to the first embodiment of the present disclosure can further include a coating layer 350 coated on an outer surface of the sidewall part 330.

The coating layer 350 can be coated on the outer surface of the sidewall part 330 to have a certain thickness. The coating layer 350 can absorb an external physical impact applied to the sidewall part 330, thereby reducing the external physical impact applied to the sidewall part 330. The coating layer 350 according to an embodiment can include one or more materials of silicon rubber, thermoplastic polyurethane, and transparent gel.

The coating layer 350 can be coated on the entire outer portion of the back cover 300. That is, the coating layer 350 can be coated on the first surface 300a and the second surface 300b of the panel supporting part 310 and side surfaces of the sidewall part 330 to have a certain thickness.

As described above, in the flexible display apparatus 10 according to the first embodiment of the present disclosure, since the back cover 300 including the plurality of openings 312 and the sidewall part 330 is disposed on the rear surface of the flexible display panel 100, the rear rigidity of the flexible display panel 100 can increase, the side rigidity of the flexible display panel 100 can increase based on the sidewall part 330 of the back cover 300, elastic compression based on the openings 312 of the back cover 300 can prevent the flexible display panel 100 from being slipped when the flexible display panel 100 is being rolled, and a bending stress applied to the flexible display panel 100 can be minimized.

Figure 5:
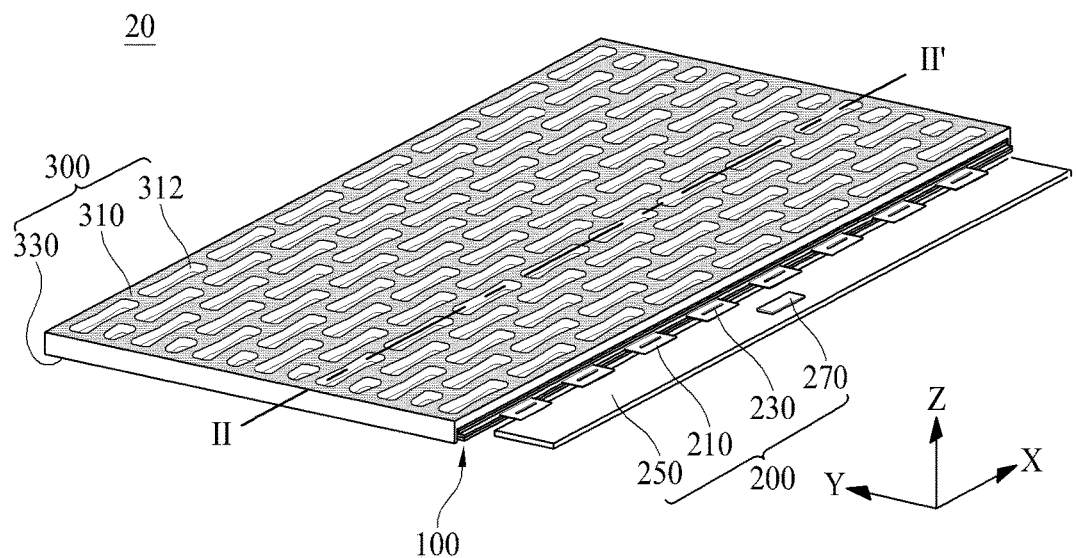
FIG. 5 is a diagram illustrating a flexible display apparatus according to a second embodiment of the present disclosure.
Figure 6:
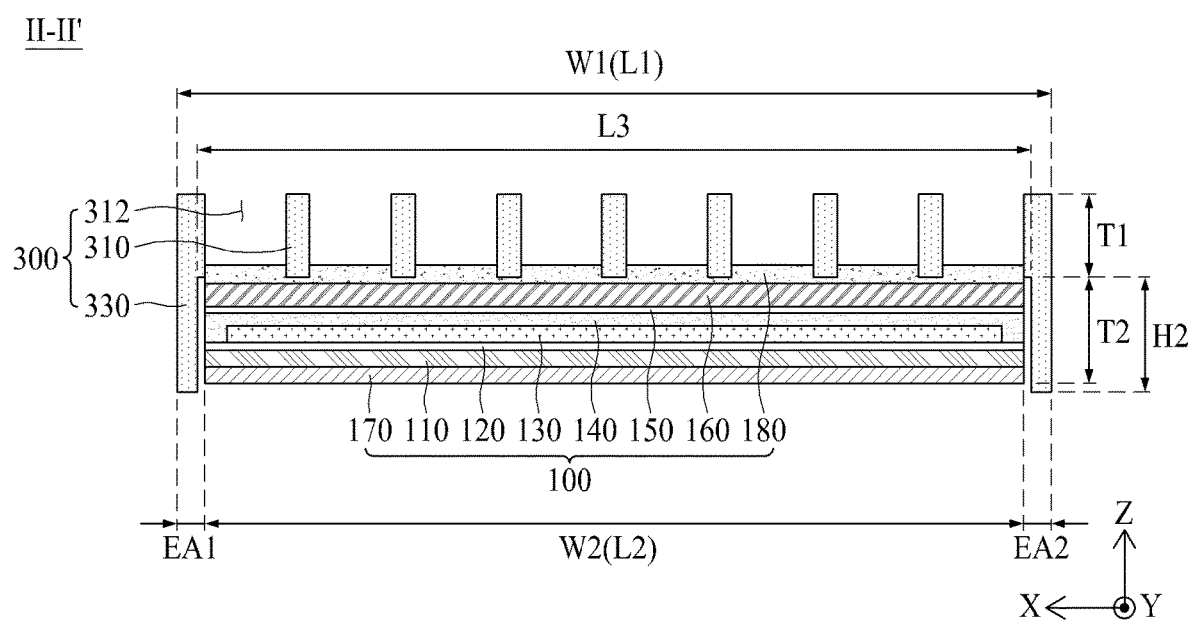
FIG. 6 is a cross-sectional view taken along line II-II' of FIG. 5.

FIG. 5 is a diagram illustrating a flexible display apparatus 20 according to a second embodiment of the present disclosure. FIG. 6 is a cross-sectional view taken along line II-II' of FIG. 5. FIG. 6 is a diagram illustrating a back cover illustrated in FIGS. 5 and 7. The flexible display apparatus 20 according to the second embodiment of the present disclosure can be implemented by modifying a structure of the back cover of the flexible display apparatus according to the first embodiment of the present disclosure illustrated in FIGS. 1 to 4. Hereinafter, therefore, only a back cover may be described, and repetitive descriptions of the other elements will be omitted or will be brief.

Figure 7:
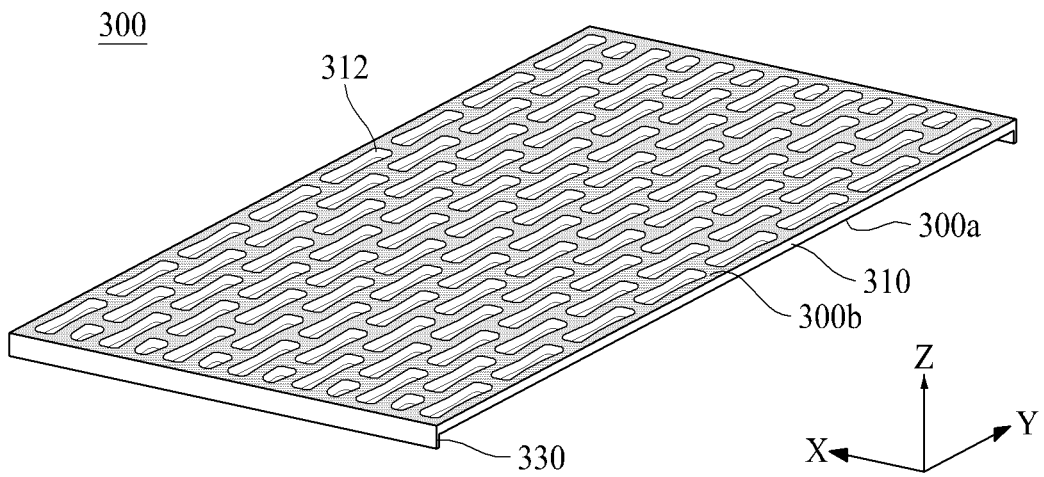
FIG. 7 is a diagram illustrating a back cover illustrated in FIGS. 5 and 6.

Referring to FIGS. 5 to 7, a back cover 300 of the flexible display apparatus 20 according to the second embodiment of the present disclosure can include a panel supporting part 310 and a sidewall part 330.

The panel supporting part 310 can be coupled to a flexible display panel 100 by a cover adhesive member 180. The panel supporting part 310 is the same as the panel supporting part of the back cover illustrated in FIGS. 1 to 4, and thus, its repetitive description is omitted or will be brief.

The sidewall part 330 can protrude from each of one edge EA1 and the other edge EA2 of the panel supporting part 310 to surround a side surface (or a short side) of the flexible display panel 100.

Except for that the sidewall part 330 protrudes from each of the one edge EA1 and the other edge EA2 of a first surface 300a of the panel supporting part 310 to have a height H2 higher than a thickness T2 of the flexible display panel 100, the sidewall part 330 according to the present embodiment is the same as the panel supporting part of the back cover illustrated in FIGS. 1 to 4, and thus, its repetitive description is omitted or will be brief.

Additionally, as illustrated in FIG. 4, the back cover 300 according to the second embodiment of the present disclosure can further include a coating layer 350 coated on an outer surface of the sidewall part 330.

The flexible display apparatus 20 according to the second embodiment of the present disclosure can have the substantially same effect as that of the flexible display apparatus 10 according to the first embodiment of the present disclosure, and particularly, the side surface (or the short side) of the flexible display panel 100 can be surrounded by the sidewall part 330 of the back cover 300, thereby better preventing the side surface of the flexible display panel 100 from being damaged due to an external physical impact.

Figure 8:
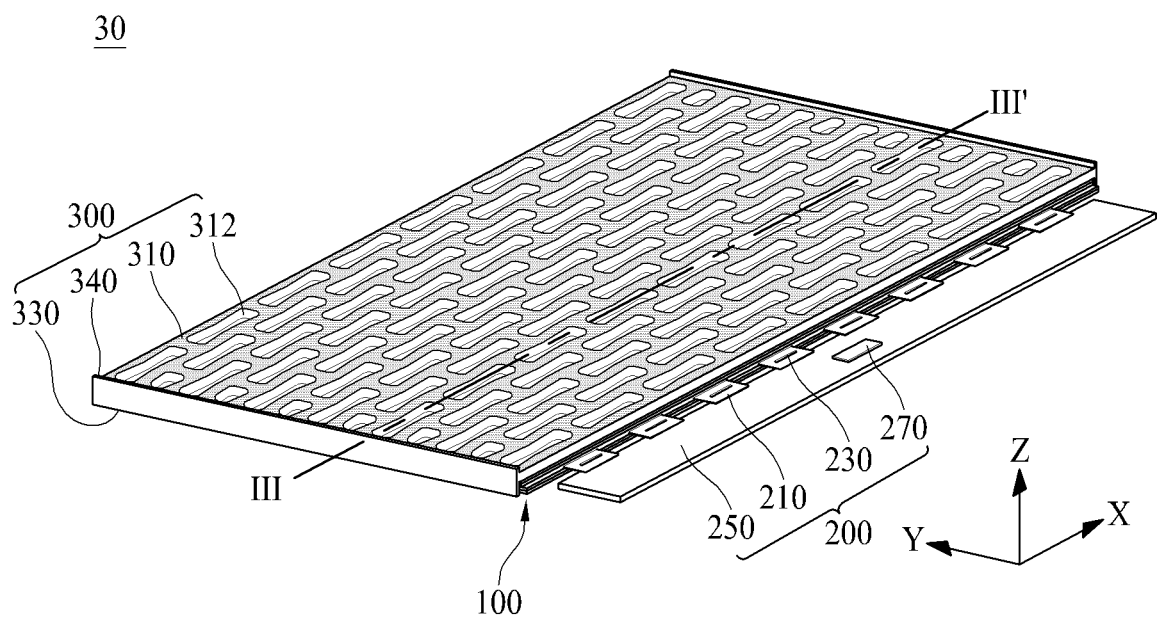
FIG. 8 is a diagram illustrating a flexible display apparatus according to a third embodiment of the present disclosure.
Figure 9:
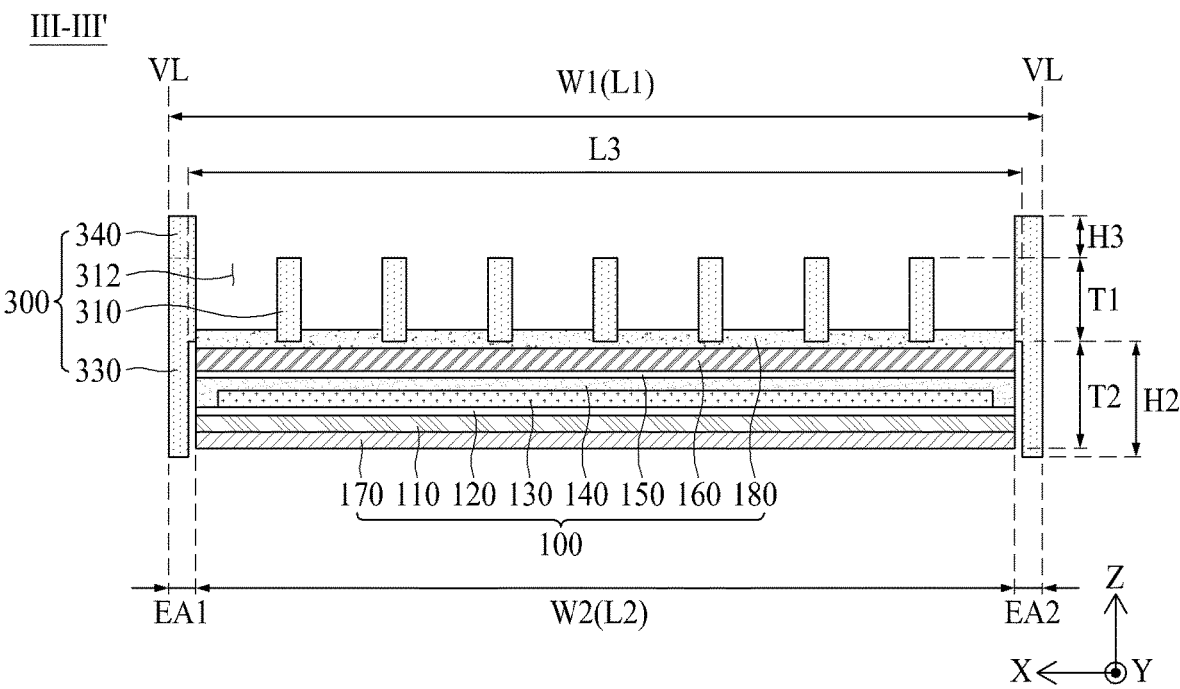
FIG. 9 is a cross-sectional view taken along line of FIG. 8.
Figure 10:
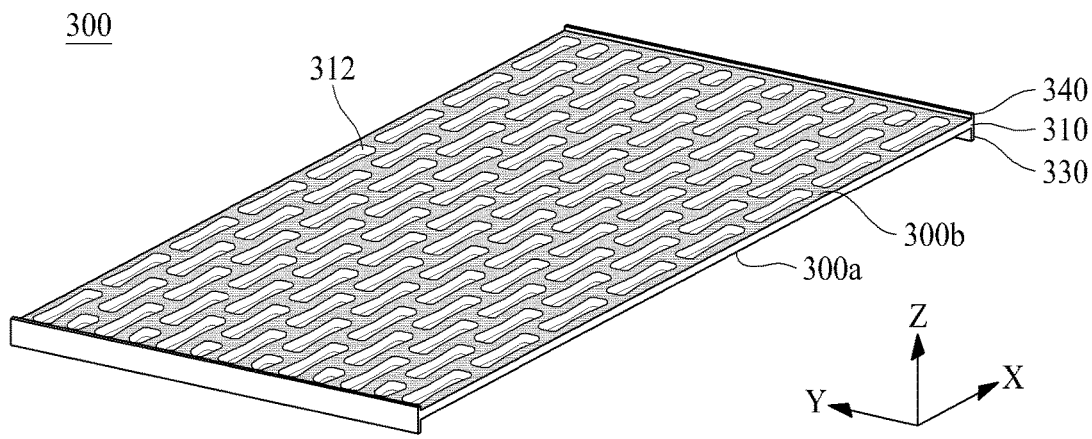
FIG. 10 is a diagram illustrating a back cover illustrated in FIGS. 8 and 9.

FIG. 8 is a diagram illustrating a flexible display apparatus 30 according to a third embodiment of the present disclosure. FIG. 9 is a cross-sectional view taken along line III-III' of FIG. 8. FIG. 10 is a diagram illustrating a back cover illustrated in FIGS. 8 and 9. The flexible display apparatus 30 according to the third embodiment of the present disclosure can be implemented by modifying a structure of the back cover of the flexible display apparatus according to the second embodiment of the present disclosure illustrated in FIGS. 5 to 7. Hereinafter, therefore, only a back cover may be described, and repetitive descriptions of the other elements will be omitted or will be brief.

Referring to FIGS. 8 to 10, a back cover 300 of the flexible display apparatus 30 according to the third embodiment of the present disclosure can include a panel supporting part 310, a sidewall part 330, and an auxiliary sidewall part 340. Except for that the back cover 300 according to the present embodiment further includes the auxiliary sidewall part 340, the back cover 300 according to the present embodiment has the same configuration as that of the back cover 300 illustrated in FIGS. 5 to 7, and thus, repetitive descriptions of the panel supporting part 310 and the sidewall part 330 may be omitted or will be brief.

The auxiliary sidewall part 340 can protrude from each of one edge EA1 and the other edge EA2 of a second surface 300b of the panel supporting part 310.

The sidewall part 330 according to an embodiment can protrude from each of the one edge EA1 and the other edge EA2 of the panel supporting part 310 to have the form of solid lines or lines long extending in a second direction Y. According to another embodiment, the sidewall part 330 can protrude from each of the one edge EA1 and the other edge EA2 of the panel supporting part 310 to have the form of dotted lines which have certain intervals therebetween and a certain length in the second direction Y, and in this case, a weight of the back cover 300 can be reduced.

The auxiliary sidewall part 340 according to an embodiment can overlap the sidewall part 330 provided on a first surface 300a of the panel supporting part 310. That is, the sidewall part 330 and the auxiliary sidewall part 340 can overlap each other with the panel supporting part 310 therebetween. In this case, an outermost surface of the auxiliary sidewall part 340 and an outermost surface of the sidewall part 330 can be disposed on the same vertical line VL. Furthermore, an outermost surface of the panel supporting part 310 can be disposed on the same vertical line VL as the outermost surface of the auxiliary sidewall part 340 and the outermost surface of the sidewall part 330.

Since the auxiliary sidewall part 340 according to the present embodiment is additionally disposed on the second surface 300b of the panel supporting part 310, the rigidity of the back cover 300 and the rigidity of the flexible display panel 100 can increase. Also, when the flexible display panel 100 is being rolled like a roll, the auxiliary sidewall part 340 and the sidewall part 330 can guide the rolling of the flexible display panel 100 to more minimize a rolling deviation between both sides (or left and right sides) of the flexible display panel 100, thereby preventing a center of the flexible display panel 100 from being crumpled due to the rolling deviation between both sides (or left and right sides) of the flexible display panel 100. Therefore, a height H3 of the auxiliary sidewall part 340 can be set to a height for preventing a contact between the flexible display panel 100 and the second surface 300b of the panel supporting part 310 when the flexible display panel 100 sags due to a self-weight of the panel supporting part 310 and a self-weight of the flexible display panel 100. For example, in a case where the height H3 of the auxiliary sidewall part 340 is excessively high, a rolling curvature of the flexible display panel 100 can increase when the flexible display panel 100 is being rolled, and thus, a bending stress applied to the flexible display panel 100 can increase. Therefore, the auxiliary sidewall part 340 can protrude from the second surface 300b of the panel supporting part 310 so that the height H3 of the auxiliary sidewall part 340 is set to a minimum height for guiding rolling of the flexible display panel 100. For example, the height H3 of the auxiliary sidewall part 340 can be set lower than a height H2 of the sidewall part 330 with respect to the panel supporting part 310.

The flexible display apparatus 30 according to the third embodiment of the present disclosure can have the same effect as that of the flexible display apparatus 20 according to the second embodiment of the present disclosure. Particularly, the auxiliary sidewall part 340 can increase the rigidity of the back cover 300, and since the auxiliary sidewall part 340 guides rolling of the flexible display panel 100, the flexible display panel 100 can be more stably rolled.

Figure 11:
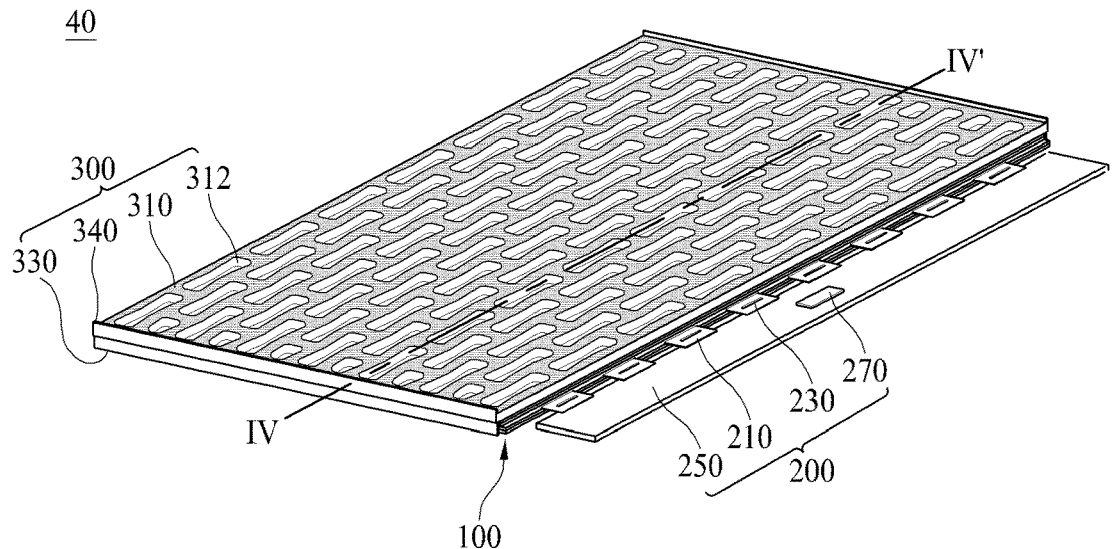
FIG. 11 is a diagram illustrating a flexible display apparatus according to a fourth embodiment of the present disclosure.
Figure 12:
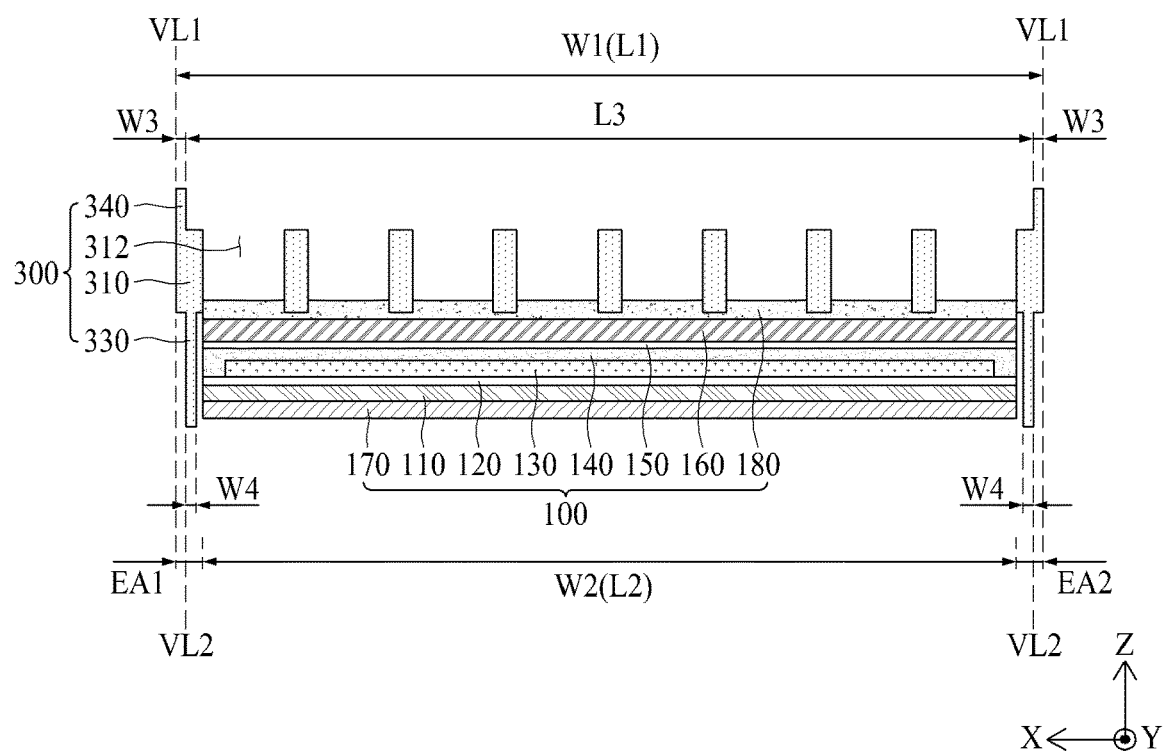
FIG. 12 is a cross-sectional view taken along line IV-IV' of FIG. 11.

FIG. 11 is a diagram illustrating a flexible display apparatus 40 according to a fourth embodiment of the present disclosure. FIG. 12 is a cross-sectional view taken along line IV-IV' of FIG. 11. The flexible display apparatus 40 according to the fourth embodiment of the present disclosure can be implemented by modifying a structure of each of the sidewall part and the auxiliary sidewall part of the back cover in the flexible display apparatus according to the third embodiment of the present disclosure illustrated in FIGS. 8 to 10. Hereinafter, therefore, only a sidewall part and an auxiliary sidewall part of a back cover will be described, and repetitive descriptions of the other elements will be omitted or will be brief.

Referring to FIGS. 11 and 12, in the flexible display apparatus 40 according to the fourth embodiment of the present disclosure, a sidewall part 330 and an auxiliary sidewall part 340 of a back cover 300 can be disposed to miss each other with a panel supporting part 310 therebetween.

The auxiliary sidewall part 340 can protrude from each of one edge EA1 and the other edge EA2 of a second surface 300b of the panel supporting part 310 not to overlap the sidewall part 330 provided on a first surface 300a of the panel supporting part 310. In this case, an outermost surface of the auxiliary sidewall part 340 can be disposed on the same first vertical line VL1 as an outermost surface of the panel supporting part 310. The auxiliary sidewall part 340 according to an embodiment can have a third width W3 with respect to a first direction X.

The sidewall part 330 can protrude from each of one edge EA1 and the other edge EA2 of the first surface 300a of the panel supporting part 310 not to overlap the auxiliary sidewall part 340 provided on the second surface 300b of the panel supporting part 310. In this case, an outermost surface of the sidewall part 330 can be disposed on the same second vertical line VL2 as an inner surface of the auxiliary sidewall part 340. That is, the sidewall part 330 can be spaced apart from the outermost surface of the panel supporting part 310 by the third width W3 of the auxiliary sidewall part 340 in a direction toward a center (or a side surface of the flexible display panel) of the panel supporting part 310, and thus, can miss the auxiliary sidewall part 340 in a vertical direction Z. The sidewall part 330 according to an embodiment can have a fourth width W4 equal to or different from the third width W3 of the auxiliary sidewall part 340 within a range which enables the sidewall part 330 to be spaced apart from the flexible display panel 100 without contacting the flexible display panel 100, with respect to the first direction X.

The sidewall part 330 and the auxiliary sidewall part 340 according to the present embodiment can have the substantially same effect as that of the flexible display apparatus 30 according to the third embodiment of the present disclosure. Particularly, when the flexible display panel 100 is being rolled, the auxiliary sidewall part 340 can surround an outer surface of the sidewall part 330 and can guide the rolling of the flexible display panel 100, thereby more minimizing a rolling deviation between both sides (e.g., left and right sides) of the flexible display panel 100. Also, when the flexible display panel 100 is being rolled, a rolling curvature of the flexible display panel 100 can decrease, and thus, a bending stress applied to the flexible display panel 100 can decrease.

Moreover, an outermost surface of the auxiliary sidewall part 340 can be disposed on the first vertical line VL1, and an outermost surface of the sidewall part 330 can be disposed on the second vertical line VL2. Otherwise, when a rolling deviation between both sides (e.g., left and right sides) of the flexible display panel 100 occurs due to an external physical impact while the flexible display panel 100 is being rolled, a physical contact occurs between the auxiliary sidewall part 340 and the flexible display panel 100, causing the damage of the flexible display panel 100. Accordingly, the outermost surface of the sidewall part 330 can be disposed on the second vertical line VL2, and the outermost surface of the auxiliary sidewall part 340 can be disposed on the first vertical line VL1.

The flexible display apparatus 40 according to the fourth embodiment of the present disclosure can have the substantially same effect as that of the flexible display apparatus 30 according to the third embodiment of the present disclosure. Particularly, the sidewall part 330 and the auxiliary sidewall part 340 can be disposed to miss each other, and thus, when the flexible display panel 100 is being rolled, the rolling curvature of the flexible display panel 100 can decrease, thereby reducing a bending stress applied to the flexible display panel 100.

Figure 13:
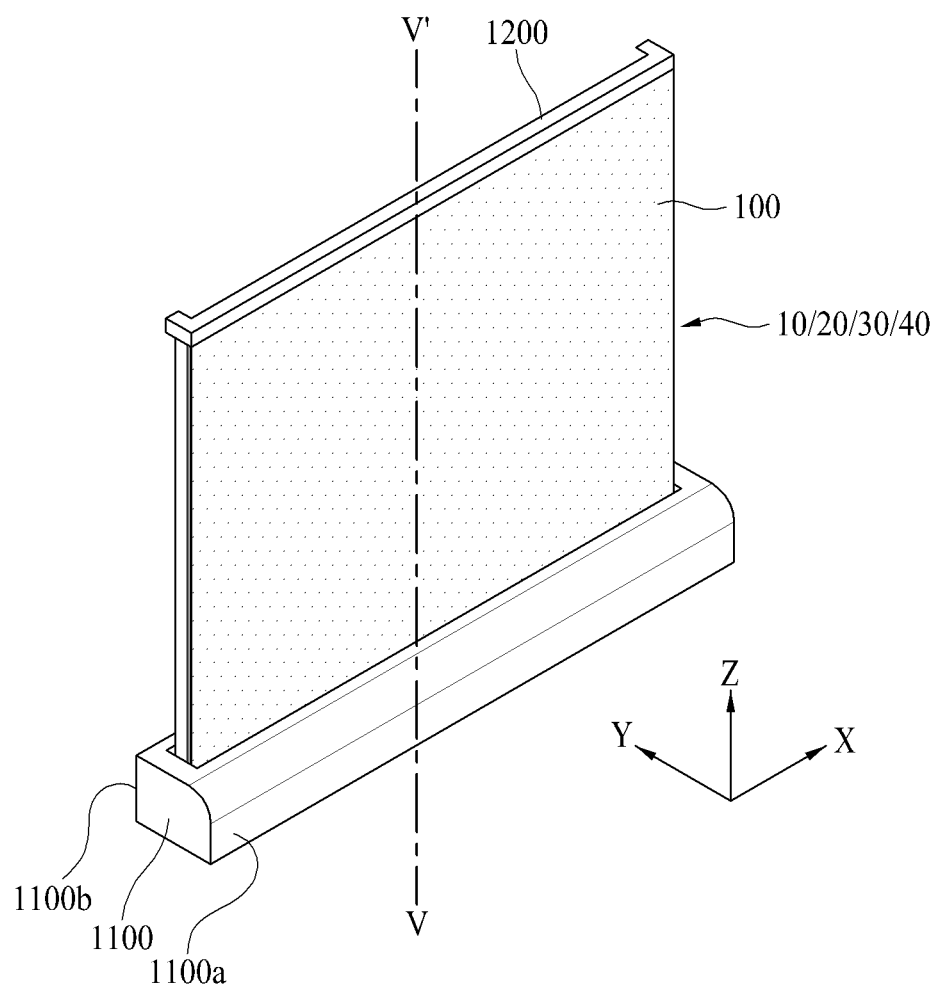
FIG. 13 is a diagram illustrating a rollable display apparatus according to an embodiment of the present disclosure.
Figure 14:
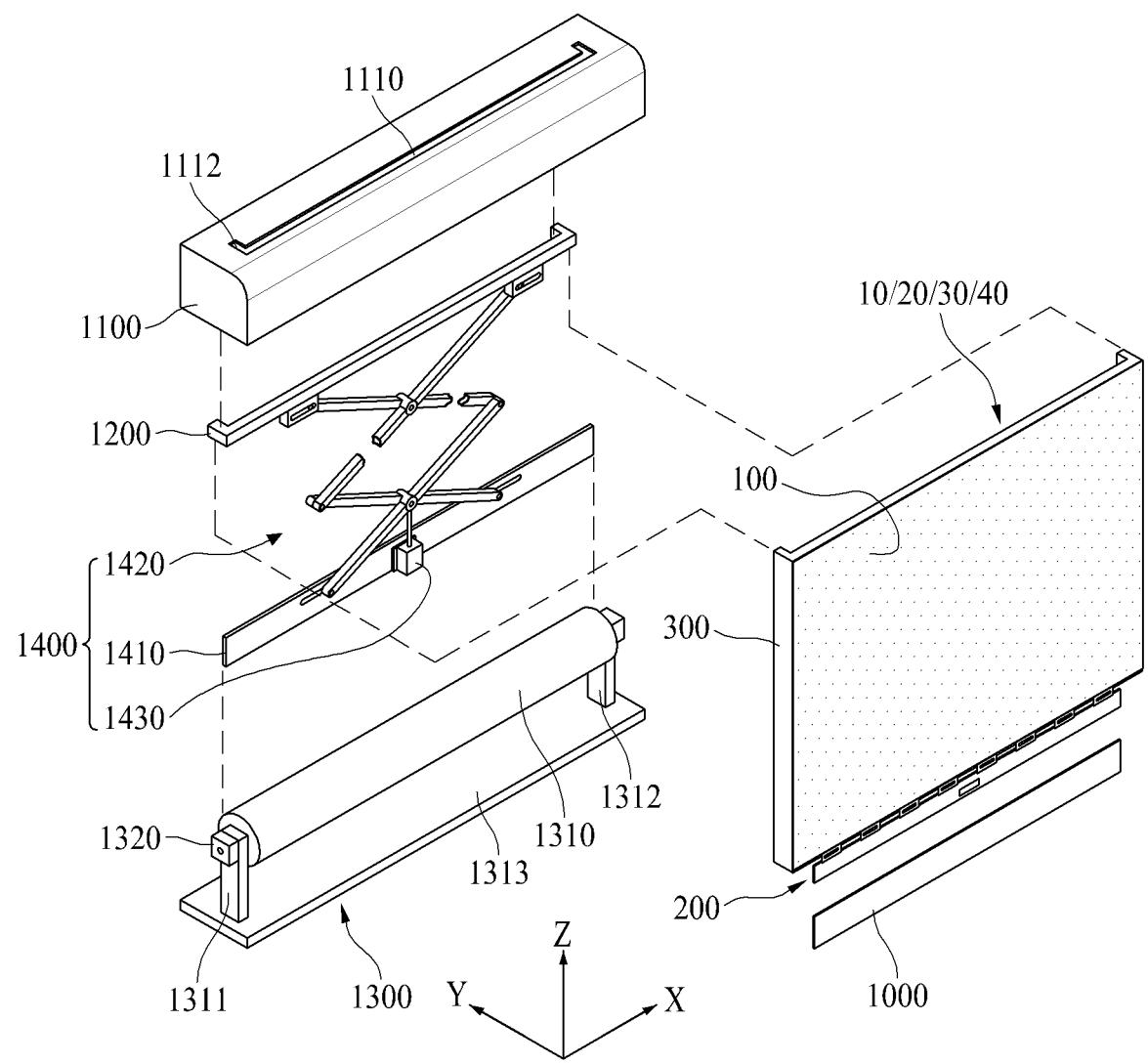
FIG. 14 is an exploded perspective view of a rollable display apparatus according to an embodiment of the present disclosure.
Figure 15:
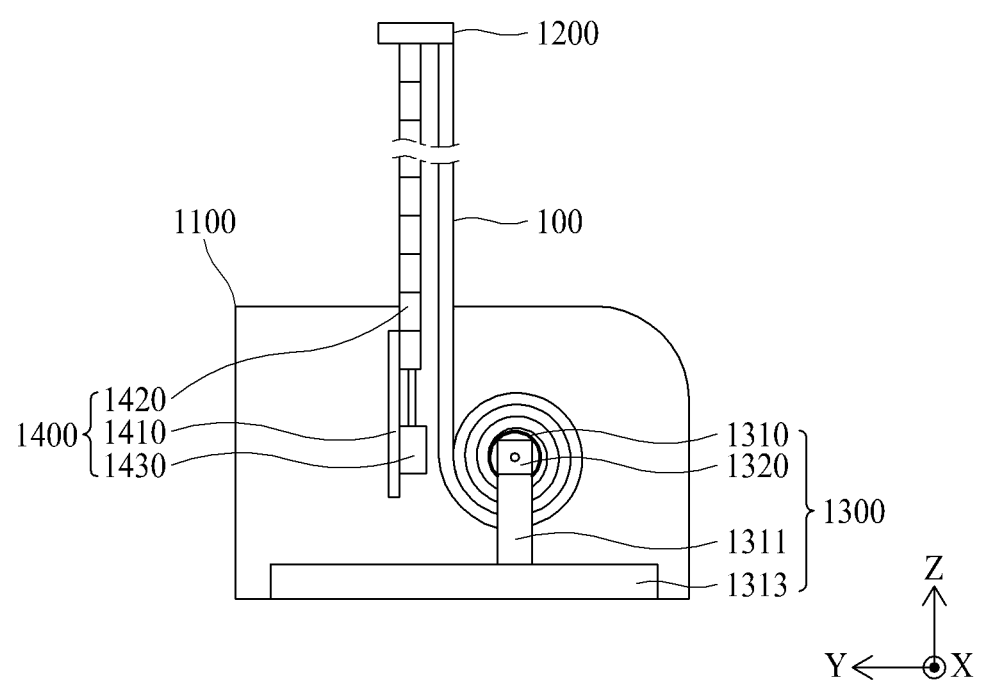
FIG. 15 is a cross-sectional view taken along line V-V' of FIG. 13.

FIG. 13 is a diagram illustrating a rollable display apparatus according to an embodiment of the present disclosure. FIG. 14 is an exploded perspective view of the rollable display apparatus according to an embodiment of the present disclosure. FIG. 15 is a cross-sectional view taken along line V-V' of FIG. 13.

Referring to FIGS. 13 to 15, the rollable display apparatus according to the embodiment of the present disclosure can include a flexible display apparatus 10/20/30/40, a housing module 1100, a housing cover 1200, a roller part 1300, and a panel rolling module 1400.

The flexible display apparatus 10/20/30/40 can include one of the flexible display apparatuses 10 to 40 according to the first to fourth embodiments of the present disclosure illustrated in FIGS. 1 to 12. Therefore, a repetitive description of the flexible display apparatus 10/20/30/40 will be omitted or will be brief.

The housing module 1100 can be a body case which the flexible display apparatus 10/20/30/40 is wound around or unwound from, and can include a panel entrance 1110 which supports the roller part 1300 and the panel rolling module 1400 and through which the flexible display panel 100 of the flexible display apparatus 10/20/30/40 moves in or out.

The panel entrance 1110 can be provided on a front surface of the housing module 1100. The panel entrance 1110 can include a guide hole 1112 which guides loading or unloading of a sidewall part provided in the back cover 300 of the flexible display apparatus 10/20/30/40. The guide hole 1112 can have the same cross-sectional structure as that of the sidewall part of the back cover 300, in order for the sidewall part of the back cover 300 to be inserted into or pass through the guide hole 1112.

For example, when the rollable display apparatus according to the present embodiment includes the flexible display apparatus 10 illustrated in FIGS. 1 to 4, the guide hole 1112 can protrude from both ends of the panel entrance 1110 to a rear surface 1100b of the housing module 1100 along a second direction Y, and thus, the panel entrance 1110 and the guide hole 1112 can two-dimensionally have a ⌞▭⌟-shaped.

As another example, when the rollable display apparatus according to the present embodiment includes the flexible display apparatus 20 illustrated in FIGS. 5 to 7, the guide hole 1112 can protrude from the both ends of the panel entrance 1110 to a front surface 1100a of the housing module 1100 along the second direction Y, and thus, the panel entrance 1110 and the guide hole 1112 can two-dimensionally have a ⌜▭⌝-shaped.

As another example, when the rollable display apparatus according to the present embodiment includes the flexible display apparatus 30 illustrated in FIGS. 8 to 10, the guide hole 1112 can protrude from the both ends of the panel entrance 1110 to the rear surface 1100b and the front surface 1100a of the housing module 1100 along the second direction Y, and thus, the panel entrance 1110 and the guide hole 1112 can two-dimensionally have a ⊢⊣-shaped.

As another example, when the rollable display apparatus according to the present embodiment includes the flexible display apparatus 40 illustrated in FIGS. 11 and 12, the guide hole 1112 can include a pair of first slits which protrude from the both ends of the panel entrance 1110 to the front surface 1100a of the housing module 1100 along the second direction Y and a pair of second slits which protrude to the rear surface 1100b of the housing module 1100 to miss the pair of first slits. Accordingly, the panel entrance 1110 and the guide hole 1111 can one-dimensionally have a ⌞▭⌟-shaped.

The housing cover 1200 can be coupled to the flexible display panel 100 of the flexible display apparatus 10/20/30/40 and can support the flexible display panel 100. The housing cover 1200 can move (e.g., raise or lower) an upper end of the flexible display panel 100 according to driving of the panel rolling module 400, and thus, can unload the flexible display panel 100 from the housing module 1100 to the outside or can load the flexible display panel 100 into the housing module 1100. At this time, when the flexible display panel 100 is loaded into the housing module 1100, the housing cover 1200 can cover the panel entrance 1110. To this end, the housing cover 1200 can have the same shape as that of the panel entrance 1110 including the guide hole 1112.

The roller part 1300 can be coupled to the other side of the flexible display panel 100 of the flexible display apparatus 10/20/30/40. That is, the roller part 1300 can be connected to a lower edge of the flexible display panel 100 by a panel connection member 1000. The roller part 1300 can wind or unwind the flexible display panel 100 according to driving of the panel rolling module 1400.

The roller part 1300 according to an embodiment can include a roller 1310, a first roller supporting part 1311, a second roller supporting part 1312, and a roller rotation means (roller rotation unit) 1320.

The roller 1310 can be rotatably installed between the first and second roller supporting parts 1311 and 1312 which are installed in parallel and spaced apart from each other by a certain interval, and can wind or unwind the flexible display panel 100 according to driving of the roller rotation means 1320.

A first roller shaft provided in one end of the roller 1310 can be rotatably installed in the first roller supporting part 1311, and a second roller shaft provided in the other end of the roller 1310 can be rotatably installed in the second roller supporting part 1312. In this case, a ball-and-roller bearing can be disposed between the first and second roller supporting parts 1311 and 1312 and a roller shaft of the roller 1310. The roller 1310 can rotate in a first direction according to a first-direction rotation of the roller rotation means 1320 to wind the flexible display panel 100, and can rotate in a second direction opposite to the first direction according to a second-direction rotation of the roller rotation means 1320 to unwind the flexible display panel 100.

The first and second roller supporting parts 1311 and 1312 can support the roller rotation means 1320 and can rotatably support both ends of the roller 1310. The first and second roller supporting parts 1311 and 1312 can be supported by a roller propping part 1313.

The roller rotation means 1320 can rotate according to control by a roller controller synchronized with driving of the panel rolling module 1400 to rotate the roller 1310, thereby winding or unwinding the flexible display panel 100 around or from the roller 1310. The roller rotation means 1320 can be installed in the first or second roller supporting part 1311 or 1312 and can be coupled to the roller shaft of the roller 1310.

The roller rotation means 1320 can include a shaft which is coupled to a roller shaft of the roller 1310. Here, a rotation coupling member can be installed between the shaft of the roller rotation means 1320 and the roller shaft of the roller 1310. For example, the roller rotation means 1320 can be an electric motor which rotates in the first direction or the second direction according to control by the roller controller.

Optionally, the roller rotation means 1320 can be omitted, and in this case, the roller part 1300 can include a spiral spring which is embedded into the roller 1310. The spiral spring can be compressed according to the first-direction rotation of the roller 1310 and can rotate the roller 1310 in the second direction according to a decompressing force.

The panel rolling module 1400 can move (e.g., raise or lower) the housing cover 1200 in order for the flexible display panel 100 to be wound around or unwound from the roller 1310. For example, the panel rolling module 1400 can raise or lower the housing cover 1200 in an up-and-down direction (or a vertical direction Z) according to control by the roller controller to raise or lower an upper end of the flexible display panel 100 in an up-and-down direction.

The panel rolling module 1400 according to an embodiment can include a lower frame 1410, at least one retractable unit 1420, and a link elevation unit 1430.

The lower frame 1410 can be connected to both side surfaces of the housing module 1100 in parallel with a first horizontal axis direction X in the housing module 1100 and can support the link elevation unit 1430. The lower frame 1410 can movably support the retractable unit 1420.

The retractable unit 1420 can include a plurality of links which are rotatably connected to one another to intersect one another in order for a length to vary. The plurality of links can be connected to a plurality of hinge members. One side of the retractable unit 1420 can be movably connected to a lower surface of the housing cover 1200, and the other side of the retractable unit 1420 can be movably connected to the lower frame 1410. The retractable unit 1420 can be coupled to the housing cover 1200 to support an upper portion of the flexible display panel 100, or may be coupled to an upper portion of the flexible display panel 100 and can raise or lower the flexible display panel 100 according to being folded or unfolded based on driving of the link elevation unit 1430.

The link elevation unit 1430 can fold or unfold the retractable unit 1420 according to control by the roller controller to raise or lower the housing cover 1200, thereby raising or lowering the flexible display panel 100. That is, the link elevation unit 1430 can raise or lower a hinge member disposed in a lowermost portion of the retractable unit 1420 to fold or unfold each of the plurality of links, thereby extending or reducing a length of the retractable unit 1420.

For example, in an operation of winding the flexible display panel 100, the link elevation unit 1430 can lower a lowermost hinge member to fold each of the plurality of links, and thus, can lower the housing cover 1200 to wind the flexible display panel 100 around the roller 1310. On the other hand, in an operation of unwinding the flexible display panel 100, the link elevation unit 1430 can raise the lowermost hinge member to unfold each of the plurality of links, and thus, can raise the housing cover 1200 to unwind the flexible display panel 100 wound around the roller 1310, thereby allowing the flexible display panel 100 to vertically stand.

The link elevation unit 1430 according to an embodiment can be configured with a linear motor or a cylinder member such as a pneumatic cylinder or an air cylinder including an elevation shaft connected to the lowermost hinge member. Therefore, in the present embodiment, the flexible display panel 100 can be easily raised or lowered by using the link elevation unit 1430, and a configuration of the link elevation unit 1430 can be simplified.

Figure 16:
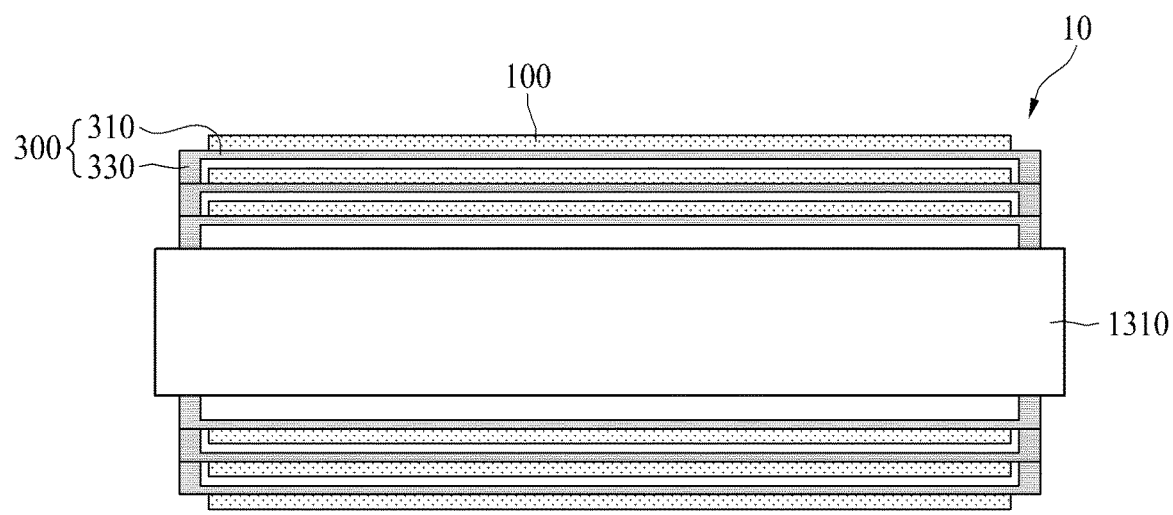
FIG. 16 is a cross-sectional view schematically illustrating a flexible display apparatus wound around a roller in a rollable display apparatus including the flexible display apparatus according to the first embodiment of the present disclosure.

FIG. 16 is a cross-sectional view schematically illustrating a flexible display apparatus wound around a roller in a rollable display apparatus including the flexible display apparatus according to the first embodiment of the present disclosure.

Referring to FIG. 16 in conjunction with FIGS. 13 to 15, the flexible display apparatus 10 of the rollable display apparatus according to the present embodiment can be wound around an outer circumference surface of the roller 1310 according to driving of the panel rolling module 1400. At this time, in the flexible display apparatus 10, the sidewall part 330 of the back cover 300 coupled to the rear surface of the flexible display panel 100 can overlap along the first surface of the panel supporting part 310, and thus, a physical contact between the front surface (or the display surface) of the flexible display panel 100 and the panel supporting part 310 of the back cover 300 can be prevented by a height of the sidewall part 330 higher than a thickness of the flexible display panel 100, thereby solving a problem caused by the physical contact between the front surface (or the display surface) of the flexible display panel 100 and the panel supporting part 310 of the back cover 300. Also, rolling of the back cover 300 can be guided by the guide hole 1112 provided in the panel entrance 1110 of the housing module 1100, and thus, the flexible display apparatus 10 can be wound around the outer circumference surface of the roller 1310 without a rolling deviation between the both sides (e.g., the left and right sides) of the flexible display panel 100, thereby solving a problem caused by the rolling deviation between the both sides (e.g., the left and right sides) of the flexible display panel 100.

Figure 17:
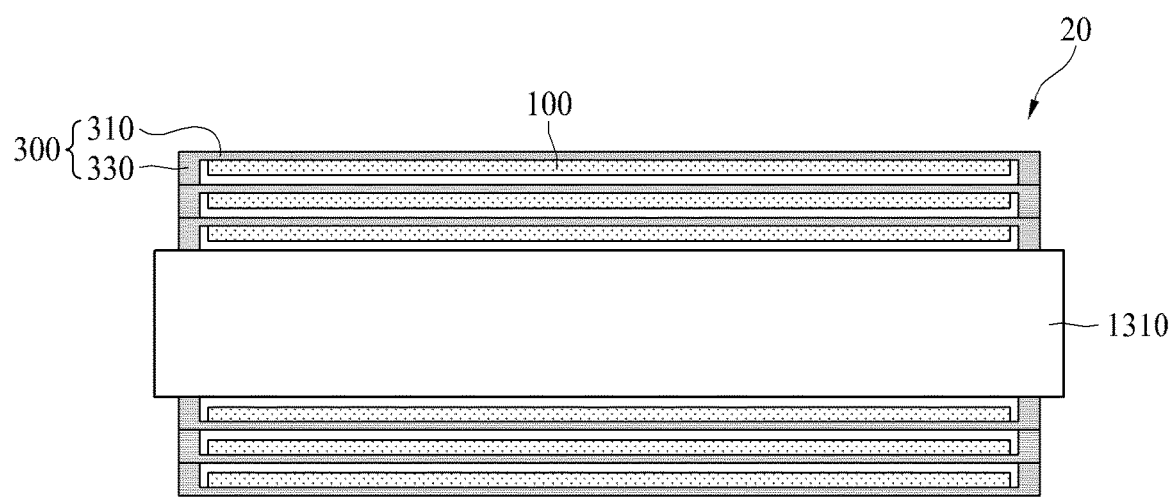
FIG. 17 is a cross-sectional view schematically illustrating a flexible display apparatus wound around a roller in a rollable display apparatus including the flexible display apparatus according to the second embodiment of the present disclosure.

FIG. 17 is a cross-sectional view schematically illustrating a flexible display apparatus wound around a roller in a rollable display apparatus including the flexible display apparatus according to the second embodiment of the present disclosure.

Referring to FIG. 17 in conjunction with FIGS. 13 to 15, the flexible display apparatus 20 of the rollable display apparatus according to the present embodiment can be wound around an outer circumference surface of the roller 1310 according to driving of the panel rolling module 1400. At this time, in the flexible display apparatus 20, the sidewall part 330 of the back cover 300 coupled to the rear surface of the flexible display panel 100 can surround the side surface of the flexible display panel 100 and can overlap along the second surface of the panel supporting part 310, and thus, a physical contact between the front surface (or the display surface) of the flexible display panel 100 and the panel supporting part 310 of the back cover 300 can be prevented by a height of the sidewall part 330 higher than a thickness of the flexible display panel 100, thereby solving a problem caused by the physical contact between the front surface (or the display surface) of the flexible display panel 100 and the panel supporting part 310 of the back cover 300. Also, rolling of the back cover 300 can be guided by the guide hole 1112 provided in the panel entrance 1110 of the housing module 1100, and thus, the flexible display apparatus 20 can be wound around the outer circumference surface of the roller 1310 without a rolling deviation between the both sides (e.g., the left and right sides) of the flexible display panel 100, thereby solving a problem caused by the rolling deviation between the both sides (e.g., the left and right sides) of the flexible display panel 100.

Figure 18:
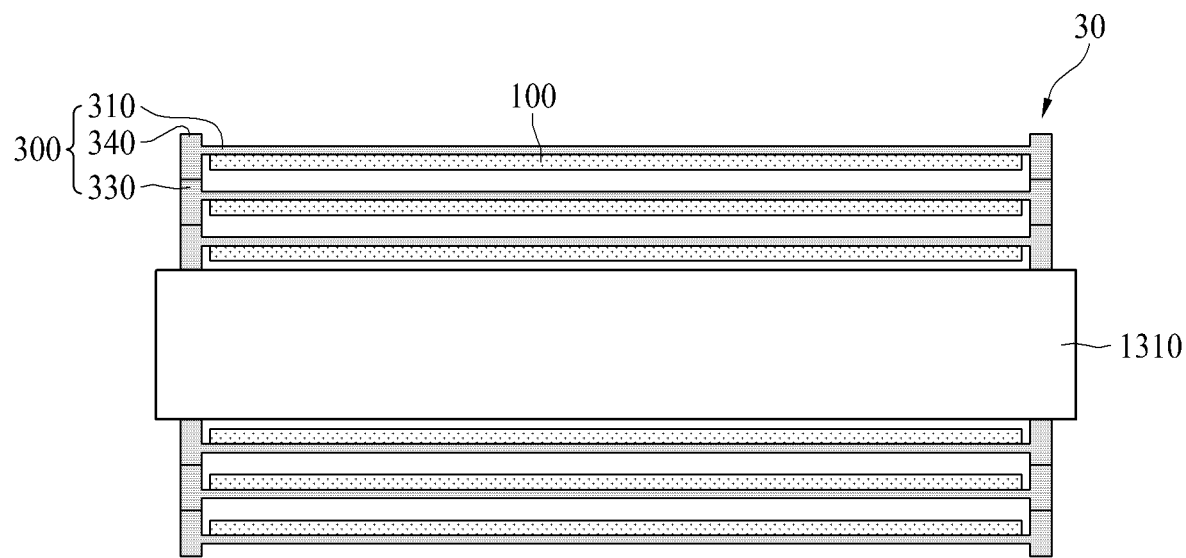
FIG. 18 is a cross-sectional view schematically illustrating a flexible display apparatus wound around a roller in a rollable display apparatus including the flexible display apparatus according to the third embodiment of the present disclosure.

FIG. 18 is a cross-sectional view schematically illustrating a flexible display apparatus wound around a roller in a rollable display apparatus including the flexible display apparatus according to the third embodiment of the present disclosure.

Referring to FIG. 18 in conjunction with FIGS. 13 to 15, the flexible display apparatus 30 of the rollable display apparatus according to the present embodiment can be wound around an outer circumference surface of the roller 1310 according to driving of the panel rolling module 1400. At this time, in the flexible display apparatus 30, the sidewall part 330 of the back cover 300 coupled to the rear surface of the flexible display panel 100 can surround the side surface of the flexible display panel 100 and can overlap the auxiliary sidewall part 340 of the panel supporting part 310, and thus, a physical contact between the front surface (or the display surface) of the flexible display panel 100 and the panel supporting part 310 of the back cover 300 can be prevented by a height of the auxiliary sidewall part 340 and a height of the sidewall part 330 higher than a thickness of the flexible display panel 100, thereby solving a problem caused by the physical contact between the front surface (or the display surface) of the flexible display panel 100 and the panel supporting part 310 of the back cover 300. Also, rolling of the back cover 300 can be guided by the guide hole 1112 provided in the panel entrance 1110 of the housing module 1100, and thus, the flexible display apparatus 30 can be wound around the outer circumference surface of the roller 1310 without a rolling deviation between the both sides (e.g., the left and right sides) of the flexible display panel 100, thereby solving a problem caused by the rolling deviation between the both sides (e.g., the left and right sides) of the flexible display panel 100.

Figure 19:
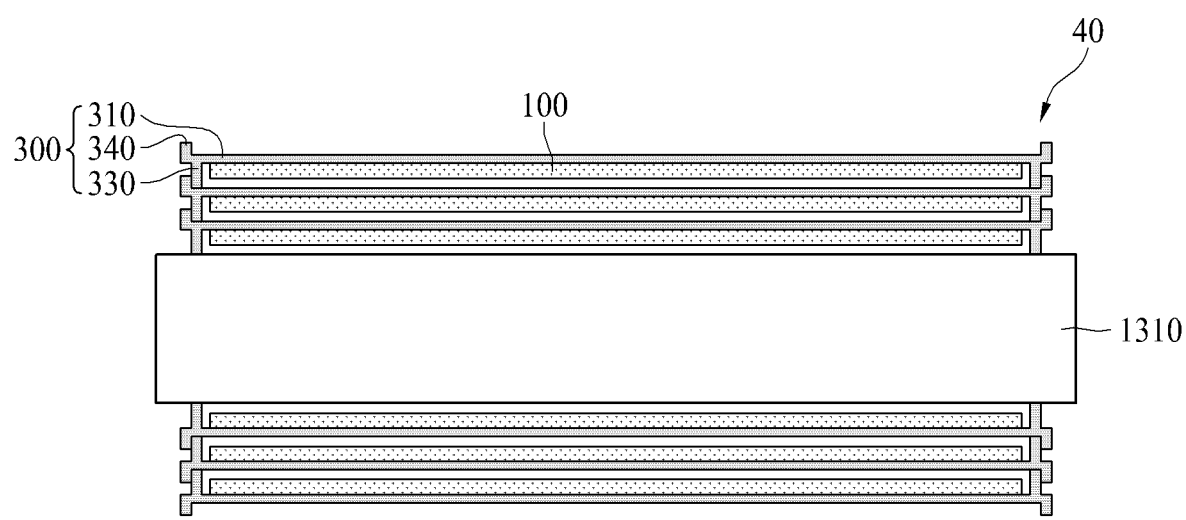
FIG. 19 is a cross-sectional view schematically illustrating a flexible display apparatus wound around a roller in a rollable display apparatus including the flexible display apparatus according to the fourth embodiment of the present disclosure.

FIG. 19 is a cross-sectional view schematically illustrating a flexible display apparatus wound around a roller in a rollable display apparatus including the flexible display apparatus according to the fourth embodiment of the present disclosure.

Referring to FIG. 19 in conjunction with FIGS. 13 to 15, the flexible display apparatus 40 of the rollable display apparatus according to the present embodiment can be wound around an outer circumference surface of the roller 1310 according to driving of the panel rolling module 1400. At this time, in the flexible display apparatus 40, the sidewall part 330 of the back cover 300 coupled to the rear surface of the flexible display panel 100 can surround the side surface of the flexible display panel 100 and can overlap to miss the auxiliary sidewall part 340 of the panel supporting part 310, and thus, a physical contact between the front surface (or the display surface) of the flexible display panel 100 and the panel supporting part 310 of the back cover 300 can be prevented by a height of the auxiliary sidewall part 340 and a height of the sidewall part 330 higher than a thickness of the flexible display panel 100, thereby solving a problem caused by the physical contact between the front surface (or the display surface) of the flexible display panel 100 and the panel supporting part 310 of the back cover 300. Also, rolling of the back cover 300 is guided by the guide hole 1112 provided in the panel entrance 1110 of the housing module 1100 and the sidewall part 330 of the back cover 300 overlaps the auxiliary sidewall part 340 in a staggered manner, and thus, the flexible display apparatus 40 can be wound around the outer circumference surface of the roller 1310 without a rolling deviation between the both sides (e.g., the left and right sides) of the flexible display panel 100, thereby solving a problem caused by the rolling deviation between the both sides (e.g., the left and right sides) of the flexible display panel 100.

The rollable display apparatus according to an embodiment of the present disclosure can include one of the flexible display apparatuses 10 to 40 according to the first to fourth embodiments of the present disclosure. Accordingly, when the flexible display panel 100 is being rolled, a problem caused by the physical contact between the front surface (or the display surface) of the flexible display panel 100 and the panel supporting part 310 of the back cover 300 is effectively solved or addressed, and a problem caused by the rolling deviation between the both sides (e.g., the left and right sides) of the flexible display panel 100 is effectively solved or addressed.

As described above, according to the embodiments of the present disclosure, the rigidity reliability of the flexible display panel is secured against a physical impact.

Moreover, according to the embodiments of the present disclosure, the side surface of the flexible display panel is prevented from being damaged or broken down due to an external physical impact applied to the side surface of the flexible display panel.

Moreover, according to the embodiments of the present disclosure, while the flexible display panel is being rolled, the flexible display panel is prevented from being damaged or broken down due to a physical contact between the back cover and the flexible display panel and/or particles which penetrate into a gap between the back cover and the flexible display panel.

Moreover, according to the embodiments of the present disclosure, the flexible display panel is prevented from being damaged or broken down due to a mismatch between both sides (e.g., the left and right sides) of the flexible display panel while the flexible display panel is being wound around the roller part.

The above-described features, structures, and effects of the present disclosure are included in at least one embodiment of the present disclosure, but are not limited to only one embodiment. Furthermore, the features, structures, and effects described in at least one embodiment of the present disclosure can be implemented through a combination or modification of any other embodiments by those skilled in the art. Therefore, content associated with the combination and modification should be construed as being within the scope of the present disclosure.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A flexible display apparatus comprising:
a flexible display panel including a display unit provided on a flexible substrate; and
a back cover disposed on a rear surface of the flexible display panel,
wherein the back cover comprises:
a panel supporting part including:
a plurality of openings extending in a first direction parallel to a thickness direction of the panel supporting part;
a first edge; and
a second edge being located opposite to the first edge in a second direction, the second direction being perpendicular to the first direction;
a first sidewall part; and
a second sidewall part,
wherein the panel supporting part supports the flexible display panel,
wherein the first sidewall part protrudes from the first edge of the panel supporting part in the first direction,
wherein the second sidewall part protrudes from the second edge of the panel supporting part in the first direction, and
wherein the first sidewall part and the second sidewall part are configured to prevent a contact between a front surface of the flexible display panel and a rear surface of the back cover when the flexible display panel is rolled.

2. The flexible display apparatus of claim 1, wherein a height of the sidewall part in the first direction is higher than the thickness of the flexible display panel in the first direction.

3. The flexible display apparatus of claim 2, wherein
the panel supporting part comprises a first surface coupled to the flexible display panel and a second surface opposite to the first surface,
the first sidewall part and the second sidewall part are provided on the first surface of the panel supporting part and surrounds a side surface of the flexible display panel, and
the back cover further comprises:
a first auxiliary sidewall part protruding from the first sidewall part; and
a second auxiliary sidewall part protruding from the second sidewall part.

4. The flexible display apparatus of claim 3, wherein each of the first auxiliary sidewall part and the second auxiliary sidewall part extend below the panel supporting part in the first direction.

5. The flexible display apparatus of claim 4, wherein the panel supporting part, is provided between the first sidewall part and the first auxiliary sidewall part, and
wherein the panel supporting part is provided between the second sidewall part and the second auxiliary sidewall part.

6. The flexible display apparatus of claim 1, wherein a thickness of the panel supporting part in the first direction is less than a thickness of the flexible display panel in the first direction.

7. The flexible display apparatus of claim 1, further comprising a light-transmitting film attached on a front surface of the flexible substrate.

8. The flexible display apparatus of claim 7, wherein the light-transmitting film comprises at least one of a polyethylene terephthalate film, an anti-reflective film, a polarizing film, and a transmittance controllable film.

9. The flexible display apparatus of claim 1, wherein the back cover comprises a metal material.

10. The flexible display apparatus of claim 9, wherein the back cover further comprises a coating layer coated on the panel supporting part, the first sidewall part and the second sidewall part or coated on an outer surface of the first sidewall part and the second sidewall part.

11. The flexible display apparatus of claim 1, wherein
the flexible display panel further comprises a passivation layer coveting the display unit and an opposite substrate covering the passivation layer,
the back cover is coupled to the opposite substrate by a cover adhesive member, and
the cover adhesive member is filled into a portion or all of each of the plurality of openings.

12. A rollable display apparatus comprising:
the flexible display apparatus of claim 1;
a housing module, the flexible display apparatus being wound around or unwound from the housing module;
a roller part installed in the housing module and connected to the flexible display apparatus; and
a panel rolling module winding or unwinding the flexible display apparatus around or from the roller part according to folding or unfolding of at least one retractable unit installed in the housing module and coupled to an upper portion of the flexible display apparatus.

13. The rollable display apparatus of claim 12, wherein
the housing module comprises a panel entrance supporting the roller part and the panel rolling module, the flexible display apparatus moving in or out through the panel entrance, and
the panel entrance guides loading or unloading of the first sidewall part and the second sidewall part provided in the back cover.

14. The rollable display apparatus of claim 13, wherein a thickness of the panel supporting part in the first direction is less than a thickness of the flexible display panel in the first direction.

15. The rollable display apparatus of claim 13, wherein the back cover further comprises a coating layer coated on the panel supporting part, the first sidewall part and the second sidewall part or coated on an outer surface of the first sidewall part and the second sidewall part.

16. The rollable display apparatus of claim 13, wherein
the back cover is coupled to the flexible display panel by a cover adhesive member, and
the cover adhesive member is filled into a portion or all of each of the plurality of openings.

17. The rollable display apparatus of claim 13, further comprising a light-transmitting film attached on a front surface of the flexible substrate.

18. The rollable display apparatus of claim 17, wherein the light-transmitting film comprises at least one of a polyethylene terephthalate film, an anti-reflective film, a polarizing film, and a transmittance controllable film.

19. The flexible display apparatus of claim 1, wherein the plurality of openings are spaced apart from one another at regular intervals in the second direction and in a third direction, the third direction being perpendicular to the first direction and the second direction, and
wherein each of the plurality of openings are provided in a same plane.

20. The flexible display apparatus of claim 1, wherein the plurality of openings are configured to elastically deform when the flexible display panel is rolled.

21. The flexible display apparatus of claim 1, wherein the first sidewall part is spaced from the flexible display panel in the first direction and the second direction,
   wherein the second sidewall part is spaced from the flexible display panel in the first direction and the second direction, and
   wherein the panel supporting part overlaps the flexible display panel in the first direction.

22. The flexible display apparatus of claim 1, wherein the panel supporting part has a width in a third direction greater than a width of the flexible display panel in the third direction, the third direction being perpendicular to the first direction and the second direction.

\* \* \* \* \*